US012635383B2

(12) United States Patent
Kim et al.

(10) Patent No.: US 12,635,383 B2
(45) Date of Patent: May 19, 2026

(54) DISPLAY DEVICE AND OPTICAL DEVICE

(71) Applicant: SAMSUNG DISPLAY CO., LTD.,
Yongin-si (KR)

(72) Inventors: Kyung Bae Kim, Yongin-si (KR); Do Yeong Park, Yongin-si (KR); Ki Hyun Pyo, Yongin-si (KR); Sung Chul Hong, Yongin-si (KR)

(73) Assignee: SAMSUNG DISPLAY CO., LTD.,
Yongin-si (KR)

( * ) Notice: Subject to any disclaimer, the term of this patent is extended or adjusted under 35 U.S.C. 154(b) by 0 days.

(21) Appl. No.: 18/820,591

(22) Filed: Aug. 30, 2024

(65) Prior Publication Data

US 2025/0194374 A1 Jun. 12, 2025

(30) Foreign Application Priority Data

Dec. 6, 2023 (KR) ......................... 10-2023-0175648

(51) Int. Cl.
| | |
|---|---|
| *H10K 59/50* | (2023.01) |
| *G02F 1/29* | (2006.01) |
| *H10K 59/80* | (2023.01) |

(52) U.S. Cl.
CPC ............... *H10K 59/50* (2023.02); *G02F 1/29* (2013.01); *H10K 59/879* (2023.02)

(58) Field of Classification Search
CPC ...... H10K 59/50; H10K 59/879; H10K 59/12; H10K 59/38; H10K 59/8791; G02F 1/29;

G02F 1/133514; G02F 1/133526; G02F 1/133528; G02F 1/1337; G02F 1/133512; G02F 1/1343; G02F 1/137; G02F 1/294; G02B 27/0101; G02B 27/0172; G02B 27/017

See application file for complete search history.

(56) References Cited

U.S. PATENT DOCUMENTS

| | | | | |
|---|---|---|---|---|
| 2022/0069034 A1 * | 3/2022 | Yoo | ...................... | H10K 59/122 |
| 2022/0115446 A1 * | 4/2022 | Kamada | ............... | H10K 59/351 |
| 2022/0131110 A1 * | 4/2022 | Ishizuya | ................ | H10K 59/35 |
| 2022/0344405 A1 * | 10/2022 | Zhu | ........................ | H10K 30/80 |

FOREIGN PATENT DOCUMENTS

KR    10-2012-0069133 A    6/2012

* cited by examiner

*Primary Examiner* — Kevin Quarterman
(74) *Attorney, Agent, or Firm* — F. CHAU & ASSOCIATES, LLC

(57) ABSTRACT

A display device includes a substrate, a first electrode disposed on the substrate, a light emitting layer disposed on the first electrode, a second electrode disposed on the light emitting layer, a color filter layer disposed on the second electrode, a lens layer disposed on the color filter layer, and a light blocking layer disposed on the lens layer and having a plurality of openings in a display area of the substrate. The openings of the light blocking layer include a first opening disposed at a central portion of the display area and a second opening disposed at an outer portion of the display area. A size of the first opening is greater than a size of the second opening.

23 Claims, 18 Drawing Sheets

DISPLAY DEVICE AND OPTICAL DEVICE

CROSS-REFERENCE TO RELATED APPLICATION

This application claims priority from Korean Patent Application No. 10-2023-0175648, filed on Dec. 6, 2023, in the Korean Intellectual Property Office, and all the benefits accruing therefrom under 35 U.S.C. 119, the contents of which in its entirety are herein incorporated by reference.

BACKGROUND

1. Technical Field

One or more embodiments described herein relate to a display device and an optical device.

2. Description of the Related Art

A head mounted display (HMD) is an image display device that is worn on the head of a user. It may take the form of glasses or a helmet and forms a focus at a distance close to and in front of the eyes of the user. The head mounted display may implement virtual reality (VR) or augmented reality (AR).

The head mounted display magnifies and displays an image displayed by a small display device using a plurality of lenses. Therefore, the display device applied to the head mounted display may provide a high-resolution image, for example, an image having a resolution of 3000 pixels per inch (PPI) or more. To this end, an organic light emitting diode on silicon (OLEDoS) has been used as the display device of the head mounted display. An OLEDoS is a small organic light emitting display device having a high resolution. It displays an image by disposing organic light emitting diodes (OLEDs) on a semiconductor wafer substrate on which complementary metal oxide semiconductors (CMOSs) are disposed.

SUMMARY

One or more embodiments described herein provide a display device and an optical device capable of improving image quality by reducing or minimizing superimposition of images and mixing of images.

According to an embodiment of the disclosure, a display device comprises a substrate; a first electrode disposed on the substrate; a light emitting layer disposed on the first electrode; a second electrode disposed on the light emitting layer; a color filter layer disposed on the second electrode; a lens layer disposed on the color filter layer; and a light blocking layer disposed on the lens layer and having a plurality of openings in a display area of the substrate, wherein the openings of the light blocking layer include a first opening disposed at a central portion of the display area and a second opening disposed at an outer portion of the display area, and a size of the first opening is greater than a size of the second opening.

In an embodiment, the size of the first opening in a first direction is the same as a pixel pitch.

In an embodiment, the size of the second opening in a first direction is smaller than a pixel pitch.

In an embodiment, further comprising a liquid crystal lens controller receiving information on a binocular distance of a user in a first direction and controlling the lens layer.

In an embodiment, the liquid crystal lens controller controls a focal distance of the lens layer based on the binocular distance.

In an embodiment, when the binocular distance is greater than a preset reference binocular distance, the liquid crystal lens controller decreases the focal distance of the lens layer, and when the binocular distance is less than the reference binocular distance, the liquid crystal lens controller increases the focal distance of the lens layer.

In an embodiment, the lens layer includes a lens area defined based on a magnitude of an electric field applied to a liquid crystal layer of the lens layer.

The lens area includes a central sub-lens area including a center of the lens layer and one or more outer sub-lens areas disposed on one side and the other side of the central sub-lens area, and the liquid crystal lens controller controls the focal distance of the lens layer by changing a width of the central sub-lens area and the number of outer sub-lens areas based on the binocular distance.

In an embodiment, when the binocular distance is greater than a preset reference binocular distance, the liquid crystal lens controller increases the width of the central sub-lens area and decreases the number of outer sub-lens areas, and when the binocular distance is less than the reference binocular distance, the liquid crystal lens controller decreases the width of the central sub-lens area and increases the number of the outer sub-lens areas.

In an embodiment, the outer sub-lens areas have smaller widths as they become more distant from the center of the lens layer.

In an embodiment, the lens layer includes: a first polarizing layer disposed on the color filter layer; a first substrate disposed on the first polarizing layer; a liquid crystal layer disposed on the first substrate; a second substrate disposed on the liquid crystal layer; and a second polarizing layer disposed on the second substrate.

In an embodiment, the first substrate includes: a first base layer disposed on the first polarizing layer; a plurality of first control electrodes disposed on the first base layer; an insulating layer disposed on the plurality of first control electrodes; and an alignment film disposed on the insulating layer.

In an embodiment, the second substrate includes: a second control electrode disposed on the liquid crystal layer; the light blocking layer disposed on the second control electrode; a second base layer disposed on the light blocking layer.

In an embodiment, the second control electrode overlaps the plurality of first control electrodes.

In an embodiment, at least two of the plurality of first control electrodes are commonly connected to one control line.

In an embodiment, at least one first control electrode disposed at a center portion of the lens layer, at least one first control electrode disposed at a first edge of the lens layer, and at least one first control electrode disposed at a second edge of the lens layer among the plurality of first control electrodes are commonly connected to the one control line.

According to an embodiment of the disclosure, an optical device comprises a display device; and an optical path converter disposed on the display device, wherein the display device includes: a substrate; a first electrode disposed on the substrate; a light emitting layer disposed on the first electrode; a second electrode disposed on the light emitting layer; a color filter layer disposed on the second electrode; a lens layer disposed on the color filter layer; and a light blocking layer disposed on the lens layer and having a plurality of openings in a display area of the substrate, the openings of the light blocking layer include a first opening disposed at a central portion of the display area and a second opening disposed at an outer portion of the display area, and a size of the first opening is greater than a size of the second opening.

In an embodiment, the size of the first opening in a first direction is the same as a pixel pitch.

In an embodiment, the size of the second opening in a first direction is smaller than a pixel pitch.

In an embodiment, the display device further includes a liquid crystal lens controller receiving information on a binocular distance of a user in a first direction and controlling the lens layer.

In an embodiment, the liquid crystal lens controller controls a focal distance of the lens layer based on the binocular distance.

In an embodiment, when the binocular distance is greater than a preset reference binocular distance, the liquid crystal lens controller decreases the focal distance of the lens layer, and when the binocular distance is less than the reference binocular distance, the liquid crystal lens controller increases the focal distance of the lens layer.

In an embodiment, the lens layer includes a lens area defined based on a magnitude of an electric field applied to a liquid crystal layer of the lens layer, the lens area includes a central sub-lens area including a center of the lens layer and one or more outer sub-lens areas disposed on one side and the other side of the central sub-lens area, and the liquid crystal lens controller controls the focal distance of the lens layer by changing a width of the central sub-lens area and the number of outer sub-lens areas based on the binocular distance.

In an embodiment, when the binocular distance is greater than a preset reference binocular distance, the liquid crystal lens controller increases the width of the central sub-lens area and decreases the number of outer sub-lens areas, and when the binocular distance is smaller than the reference binocular distance, the liquid crystal lens controller decreases the width of the central sub-lens area and increases the number of the outer sub-lens areas.

With a display device according to the present disclosure, a color gamut may be improved, and a thickness of a filling layer may be reduced or minimized.

In accordance with one or more embodiments, a display device comprising a plurality of pixels in a display area, a lens layer disposed over the plurality of pixels, and a light blocking layer disposed on the lens layer. The lens layer includes a liquid crystal layer between a plurality of first electrodes and a common second electrode, voltages applied to the plurality of first electrodes and the second electrode to generate an electric field to control tilt angles of liquid crystal molecules in the liquid crystal layer, the voltages applied to the plurality of first electrodes changing to control a focal distance of the lens layer. The light blocking layer includes at least one first opening disposed at a central portion of the display area and at least one second opening disposed at an outer portion of the display area, and wherein a size of the first opening is greater than a size of the second opening.

The voltages applied to the plurality of first electrodes change to control the focal distance of the lens layer to correspond to a binocular distance between the eyes of a user. The lens layer includes a central sub-lens area and a plurality of outer sub-lens areas disposed on respective sides of the central sub-lens area, and a number of the outer sub-lens areas change when the focal distance of the lens layer changes. The size of the first opening in a first direction is substantially equal to a pitch between adjacent ones of the plurality of pixels. The size of the second opening in the first direction is smaller than the pitch between adjacent ones of the plurality of pixels.

The effects of the present disclosure are not limited to the above-described effects and other effects which are not described herein will become apparent to those skilled in the art from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 1 is an exploded perspective view illustrating a display device according to an exemplary embodiment;

FIG. 12 is a view illustrating a cross section and a refractive index distribution of a lens layer of a display device according to an exemplary embodiment;

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Features of various embodiments of the present disclosure may be combined partially or totally. As will be clearly appreciated by those skilled in the art, technically various interactions and operations are possible. Various embodiments can be practiced individually or in combination.

Hereinafter, embodiments will be described in detail with reference to the accompanying drawings.

Figure 1:
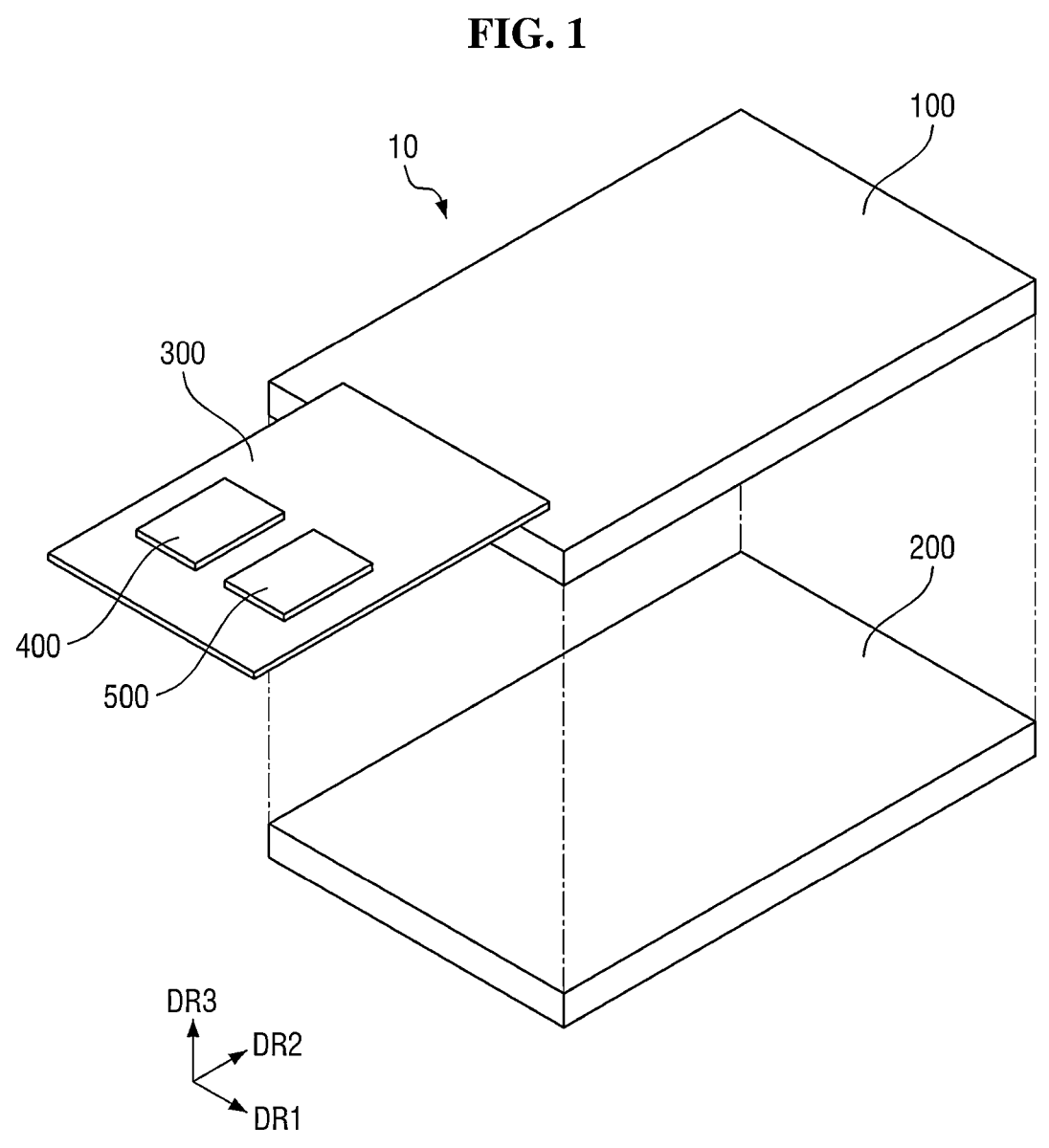
Figure 2:
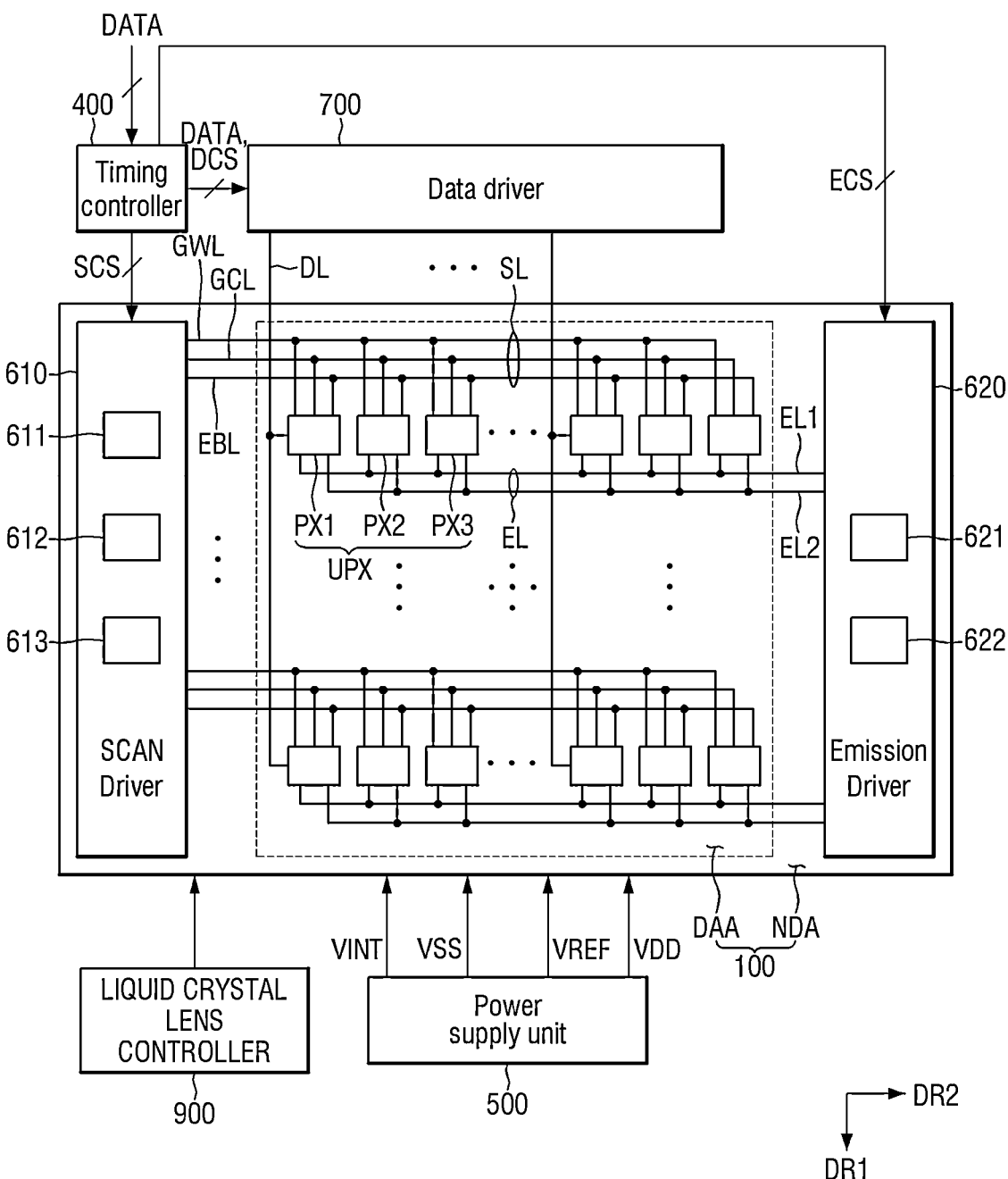
FIG. 2 is a block diagram illustrating the display device according to an exemplary embodiment.

FIG. 1 is an exploded perspective view illustrating a display device 10 according to an exemplary embodiment. FIG. 2 is a block diagram illustrating the display device 10 according to an exemplary embodiment.

Referring to FIGS. 1 and 2, the display device 10 according to an exemplary embodiment is a device that displays a moving image or a still image. The display device 10 according to an exemplary embodiment may be applied to portable electronic devices. Examples include mobile phones, smartphones, tablet personal computers (PCs), mobile communication terminals, electronic notebooks, electronic books, portable multimedia players (PMPs), navigation devices, and ultra mobile PCs (UMPCs). Additionally, the display device 10 according an exemplary embodiment may also be applied as a display unit of televisions, laptop computers, monitors, billboards, or the Internet of Things (IOTs). As additional examples, the display device 10 according an exemplary embodiment may be applied to smart watches, watch phones, or head mounted displays (HMDs) for implementing virtual reality and augmented reality.

The display device 10 according to an exemplary embodiment includes a display panel 100, a heat dissipation layer 200, a circuit board 300, a timing controller 400, and a power supply unit 500.

The display panel 100 may have a predetermined shape, e.g., a shape similar to a rectangular shape in plan view. For example, the display panel 100 may have a shape similar to a rectangular shape in plan view, having short sides extending in a first direction DR1 and long sides extending in a second direction DR2 crossing the first direction DR1. In the display panel 100, a corner where the short side in the first direction DR1 and the long side in the second direction DR2 meet may be rounded with a predetermined curvature or may be right-angled. The shape of the display panel 100 in plan view is not limited to the rectangular shape, and may be a shape similar to other polygonal shapes, a circular shape, or an elliptical shape. A shape of the display device 10 in plan view may correspond to the shape of the display panel 100 in plan view, but an exemplary embodiment of the present disclosure is not limited thereto.

The display panel 100 may include a display area DAA that displays an image and a non-display area NDA that does not display an image, as illustrated in FIG. 2.

The display area DAA includes a plurality of unit pixels UPX, a plurality of scan lines SL, a plurality of emission control lines EL, and a plurality of data lines DL. The plurality of unit pixels UPX may be arranged in a matrix form in the first direction DR1 and the second direction DR2. The plurality of scan lines SL and the plurality of emission control lines EL may extend in the first direction DR1 and may be disposed in the second direction DR2. The plurality of data lines DL may extend in the second direction DR2 and may be disposed in the first direction DR1.

The plurality of scan lines SL includes a plurality of write scan lines GWL, a plurality of control scan lines GCL, and a plurality of bias scan lines EBL. The plurality of emission control lines EL include a plurality of first emission control lines EL1 and a plurality of second emission control lines EL2.

Figure 3:
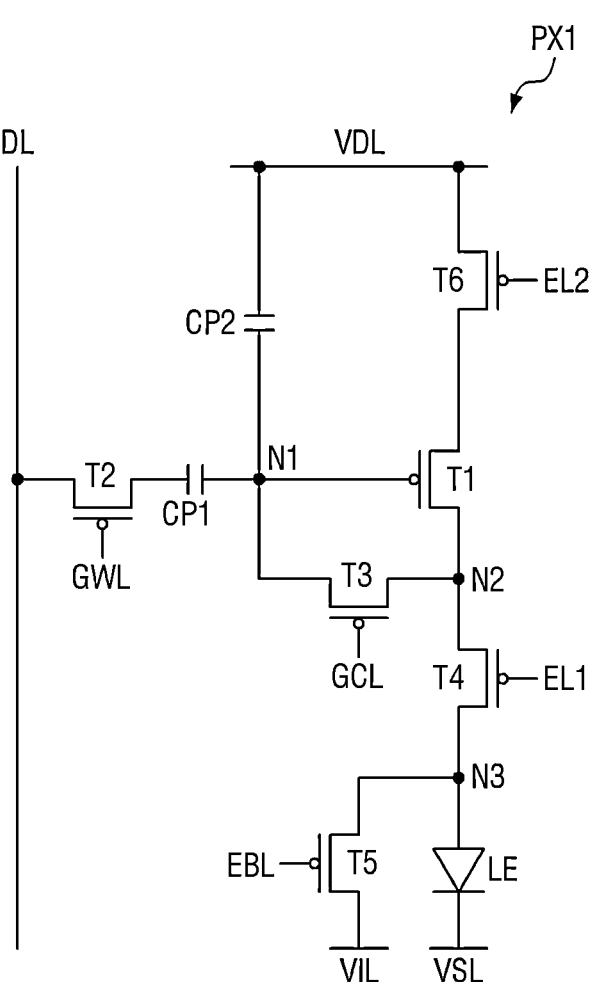
FIG. 3 is an equivalent circuit diagram of a first pixel according to an exemplary embodiment.

Each of a plurality of unit pixels UPX includes a predetermined number of pixels, e.g., three pixels PX1, PX2, and PX3. The plurality of pixels PX1, PX2, and PX3 may include a plurality of pixel transistors (e.g., as illustrated in FIG. 3). The plurality of pixel transistors may be formed by a semiconductor process and may be disposed on a semiconductor substrate SSUB (e.g., see FIG. 7). For example, a plurality of pixel transistors of a data driver 700 may be formed as complementary metal oxide semiconductors (CMOSs).

Each of the plurality of pixels PX1, PX2, and PX3 may be connected to corresponding ones of the plurality of write scan lines GWL, the plurality of control scan lines GCL, the plurality of bias scan lines EBL, the plurality of first emission control lines EL1, the plurality of second emission control lines EL2, and the plurality of data lines DL. Each of the plurality of pixels PX1, PX2, and PX3 may receive a data voltage of the data line DL according to a write scan signal of the write scan line GWL. A light emitting element LE may emit light according to the data voltage.

The non-display area NDA includes a scan driver 610, an emission driver 620, and a data driver 700. The scan driver 610 includes a plurality of scan transistors, and the emission driver 620 includes a plurality of light emitting transistors. The plurality of scan transistors and the plurality of light emitting transistors may be formed by a semiconductor process and may be formed on a semiconductor substrate SSUB (e.g., see FIG. 7). For example, the plurality of scan transistors and the plurality of light emitting transistors may be formed using CMOS logic. It has been illustrated in FIG. 2 that the scan driver 610 is disposed on the left side of the display area DAA and the emission driver 620 is disposed on the right side of the display area DAA, but the locations of the scan driver 610 and/or the emission driver 620 may be different in other exemplary embodiments of the present disclosure. For example, the scan drivers 610 and the emission drivers 620 may be disposed on both the left and right sides of the display area DAA.

The scan driver 610 may include a write scan signal output unit 611, a control scan signal output unit 612, and a bias scan signal output unit 613. Each of the write scan signal output unit 611, the control scan signal output unit 612, and the bias scan signal output unit 613 may receive a scan timing control signal SCS from the timing controller 400. The write scan signal output unit 611 may generate write scan signals according to the scan timing control signal SCS of the timing controller 400 and may sequentially output the write scan signals to the write scan lines GWL. The control scan signal output unit 612 may generate control scan signals according to the scan timing control signal SCS and may sequentially output the control scan signals to the control scan lines GCL. The bias scan signal output unit 613 may generate bias scan signals according to the scan timing control signal SCS and may sequentially output the bias scan signals to the bias scan lines EBL.

The emission driver 620 includes a first emission control driver 621 and a second emission control driver 622. Each of the first emission control driver 621 and the second emission control driver 622 may receive an emission timing control signal ECS from the timing controller 400. The first emission control driver 621 may generate first emission control signals according to the emission timing control signal ECS and may sequentially output the first emission control signals to the first emission control lines EL1. The second emission control driver 622 may generate second emission control signals according to the emission timing control signal ECS and may sequentially output the second emission control signals to the second emission control lines EL2.

The data driver 700 may include a plurality of data transistors formed by a semiconductor process. The plurality of data transistors may be formed on a semiconductor substrate SSUB (e.g., see FIG. 7). For example, the plurality of data transistors may be formed using CMOS logic.

The data driver 700 may receive digital video data DATA and a data timing control signal DCS from the timing controller 400. The data driver 700 converts the digital video data DATA into analog data voltages according to the data timing control signal DCS and outputs the analog data voltages to the data lines DL. In this case, the pixels PX1, PX2, and PX3 of each unit pixel UPX may be selected by the write scan signals of the scan driver 610, and the data voltages may be supplied to respective ones of the selected pixels PX1, PX2, and PX3.

Referring again to FIG. 1, the heat dissipation layer 200 may overlap the display panel 100 in a third direction DR3, which is a thickness direction of the display panel 100. The heat dissipation layer 200 may be disposed on one surface, for example, a rear surface, of the display panel 100. The heat dissipation layer 200 serves to dissipate heat generated from the display panel 100. The heat dissipation layer 130 may include a metal layer made, for example, of graphite, silver (Ag), copper (Cu), aluminum (Al) or another metal having high thermal conductivity.

The circuit board 300 may be electrically connected to a plurality of first pads PD1 of a first pad unit PDA1 (e.g., see FIG. 4) of the display panel 100 using a conductive adhesive member such as but not limited to an anisotropic conductive film. The circuit board 300 may be a flexible printed circuit board or a flexible film having a flexible material. It has been illustrated in FIG. 1 that the circuit board 300 is unbent, but the circuit board 300 may be bent, folded, or rolled in another embodiment. In this case, one end of the circuit board 300 may be disposed on the rear surface of the display panel 100 and/or a rear surface of the heat dissipation layer 200. The one end of the circuit board 300 may be an end opposite to the other end of the circuit board 300 connected to the plurality of first pads PD1 of the first pad unit PDA1 (e.g., see FIG. 4) of the display panel 100 using the conductive adhesive member.

The timing controller 400 may receive digital video data and timing signals from an external source or host. The timing controller 400 may generate the scan timing control signal SCS, the emission timing control signal ECS, and the data timing control signal DCS for controlling the display panel 100 according to the timing signals. The timing controller 400 may output the scan timing control signal SCS to the scan driver 610 and output the emission timing control signal ECS to the emission driver 620. The timing controller 400 may output the digital video data and the data timing control signal DCS to the data driver 700.

The power supply unit 500 may generate a plurality of panel driving voltages according to an external source voltage. For example, the power supply unit 500 may generate a first driving voltage VSS, a second driving voltage VDD, and a third driving voltage VINT, and may supply the first driving voltage VSS, the second driving voltage VDD, and the third driving voltage VINT to the display panel 100. The first driving voltage VSS, the second driving voltage VDD, and the third driving voltage VINT will be described in greater detail below with reference to FIG. 3.

Each of the timing controller 400 and the power supply unit 500 may be formed as an integrated circuit (IC) and attached to one surface of the circuit board 300. In this case, the scan timing control signal SCS, the emission timing control signal ECS, the digital video data DATA, and the data timing control signal DCS of the timing controller 400 may be supplied to the display panel 100 through the circuit board 300. In addition, the first driving voltage VSS, the second driving voltage VDD, and the third driving voltage VINT of the power supply unit 500 may be supplied to the display panel 100 through the circuit board 300.

In one embodiment, each of the timing controller 400 and the power supply unit 500 may be disposed in the non-display area NDA of the display panel 100, similar to the scan driver 610, the emission driver 620, and the data driver 700. In this case, the timing controller 400 may include a plurality of timing transistors, and the power supply unit 500 may include a plurality of power transistors. The plurality of timing transistors and the plurality of power transistors may be formed by a semiconductor process and may be formed on a semiconductor substrate SSUB (e.g., see FIG. 7). For example, the plurality of timing transistors and the plurality of power transistors may be formed using CMOS logic. Each of the timing controller 400 and the power supply unit 500 may be disposed between the data driver 700 and the first pad unit PDA1 (e.g., sce FIG. 4).

The display device according to an exemplary embodiment may further include a liquid crystal lens controller 900. The liquid crystal lens controller 900 may receive information on a binocular distance of a user and control a lens layer based on the binocular distance.

FIG. 3 is an equivalent circuit diagram of a first pixel PX1 according to an exemplary embodiment.

Referring to FIG. 3, the first pixel PX1 may be connected to a write scan line GWL, a control scan line GCL, a bias scan line EBL, a first emission control line EL1, a second emission control line EL2, and a data line DL. In addition, the first pixel PX1 may be connected to a first driving voltage line VSL to which a first driving voltage VSS corresponding to a first (low) potential voltage is applied, a second driving voltage line VDL to which a second driving voltage VDD corresponding to a second (high) potential voltage is applied, and a third driving voltage line VIL to which a third driving voltage VINT corresponding to an initialization voltage is applied. That is, the first driving voltage line VSL may be a low potential voltage line, the second driving voltage line VDL may be a high potential voltage line, and the third driving voltage line VIL may be an initialization voltage line. In this case, the first driving voltage VSS may be a voltage lower than the third driving voltage VINT. The second driving voltage VDD may be a voltage higher than the third driving voltage VINT.

The first pixel PX1 includes a plurality of transistors T1 to T6, a light emitting element LE, a first capacitor CP1, and a second capacitor CP2. The light emitting element LE emits light according to a driving current Ids flowing through a channel of a first transistor T1. An amount of light emitted from the light emitting element LE may be proportional to the driving current Ids. In this example embodiment, the light emitting element LE may be disposed between a fourth transistor T4 and the first driving voltage line VSL. A first electrode of the light emitting element LE may be connected to a drain electrode of the fourth transistor T4, and a second electrode of the light emitting element LE may be connected to the first driving voltage line VSL. The first electrode of the light emitting element LE may be an anode electrode, and the second electrode of the light emitting element LE may be a cathode electrode. The light emitting element LE may be an organic light emitting diode including a first electrode, a second electrode, and an organic light emitting layer disposed between the first electrode and the second electrode, but an exemplary embodiment of the present disclosure is not limited thereto. For example, the light emitting element LE may be an inorganic light emitting element including a first electrode, a second electrode, and an inorganic semiconductor disposed between the first electrode and the second electrode, and in this case, the light emitting element LE may be a micro light emitting diode.

The first transistor T1 may be a driving transistor controlling a source-drain current Ids (hereinafter referred to as a "driving current") flowing between a source electrode and a drain electrode according to a voltage applied to a gate electrode thereof. The first transistor T1 includes the gate electrode connected to a first node N1, the source electrode connected to a drain electrode of a sixth transistor T6, and the drain electrode connected to a second node N2.

A second transistor T2 may be disposed between one electrode of the first capacitor CP1 and the data line DL. The second transistor T2 is turned on by a write scan signal of the write scan line GWL to connect one electrode of the first capacitor CP1 to the data line DL. When configured in this manner, a data voltage of the data line DL may be applied to one electrode of the first capacitor CP1. The second transistor T2 includes a gate electrode connected to the write scan line GWL, a source electrode connected to the data line DL, and a drain electrode connected to one electrode of the first capacitor CP1 at the first node N1.

A third transistor T3 may be disposed between the first node N1 and the second node N2. The third transistor T3 is turned on by a write control signal of the write control line GCL to connect the first node N1 to the second node N2. When configured in this manner, the gate electrode and the drain electrode of the first transistor T1 are connected to each other, in which case the first transistor T1 operates like a diode, e.g., is diode-connected. The third transistor T3 includes a gate electrode connected to the write control line GCL, a source electrode connected to the second node N2, and a drain electrode connected to the first node N1.

The fourth transistor T4 may be connected between the second node N2 and a third node N3. The fourth transistor T4 is turned on by a first emission control signal of the first emission control line EL1 to connect the second node N2 to the third node N3. When configured in this manner, the driving current of the first transistor T1 may be supplied to the light emitting element LE through the second node N2 and the third node N3. The fourth transistor T4 includes a gate electrode connected to the first emission control line EL1, a source electrode connected to the second node N2, and the drain electrode connected to the third node N3.

A fifth transistor T5 may be disposed between the third node N3 and the third driving voltage line VIL. The fifth transistor T5 is turned on by a bias scan signal of the bias scan line EBL to connect the third node N3 to the third driving voltage line VIL. When configured in this manner, the third driving voltage VINT of the third driving voltage line VIL may be applied to the first electrode of the light emitting element LE to initialize the light emitting element LE. The fifth transistor T5 includes a gate electrode connected to the bias scan line EBL, a source electrode connected to the third node N3, and a drain electrode connected to the third driving voltage line VIL.

The sixth transistor T6 may be disposed between the source electrode of the first transistor T1 and the second driving voltage line VDL. The sixth transistor T6 is turned on by a second emission control signal of the second emission control line EL2 to connect the source electrode of the first transistor T1 to the second driving voltage line VDL. When configured in this manner, the second driving voltage VDD of the second driving voltage line VDL may be applied to the source electrode of the first transistor T1. The sixth transistor T6 includes a gate electrode connected to the second emission control line EL2, a source electrode connected to the second driving voltage line VDL, and the drain electrode connected to the source electrode of the first transistor T1.

The first capacitor CP1 is connected between the first node N1 and the drain electrode of the second transistor T2, e.g., the first capacitor CP1 includes one electrode connected to the drain electrode of the second transistor T2 and the other electrode connected to the first node N1.

The second capacitor CP2 is connected between the gate electrode of the first transistor T1 at node N1 and the second driving voltage line VDL, e.g., the second capacitor CP2 includes one electrode connected to the gate electrode of the first transistor T1 and the other electrode connected to the second driving voltage line VDL.

The first node N1 is a contact point between the gate electrode of the first transistor T1, the drain electrode of the third transistor T3, the other electrode of the first capacitor CP1, and one electrode of the second capacitor CP2. The second node N2 is a contact point between the drain electrode of the first transistor T1, the source electrode of the third transistor T3, and the source electrode of the fourth transistor T4. The third node N3 is a contact point between the drain electrode of the fourth transistor T4, the source electrode of the fifth transistor T5, and the first electrode of the light emitting element LE.

Each of the first to sixth transistors T1 to T6 may be a metal oxide semiconductor field effect transistor (MOSFET). For example, each of the first to sixth transistors T1 to T6 may be a P-type MOSFET, but an exemplary embodiment of the present disclosure is not limited thereto. Each of the first to sixth transistors T1 to T6 may be an N-type MOSFET. In one embodiment, some of the first to sixth transistors T1 to T6 may be P-type MOSFETs, and the others of the first to sixth transistors T1 to T6 may be N-type MOSFETs.

It has been illustrated in FIG. 3 that the first pixel PX1 includes six transistors T1 to T6 and two capacitors CP1 and CP2, but it is to be noted that an equivalent circuit diagram of the first pixel PX1 is not limited to that illustrated in FIG. 3. For example, the numbers of transistors and/or capacitors of the first pixel PX1 may be different in other embodiments than those illustrated in FIG. 3.

In addition, an equivalent circuit diagram of a second pixel PX2 and an equivalent circuit diagram of a third pixel PX3 may be substantially the same as the equivalent circuit diagram of the first pixel PX1 described with reference to FIG. 3, with the exception that the light emitting element LE of the second pixel PX2 and the third pixel PX3 may emit light of different colors compared to the light emitted from the first pixel PX1. Therefore, a description of the equivalent circuit diagram of the second pixel PX2 and the equivalent circuit diagram of the third pixel PX3 is omitted in the present disclosure.

Figure 4:
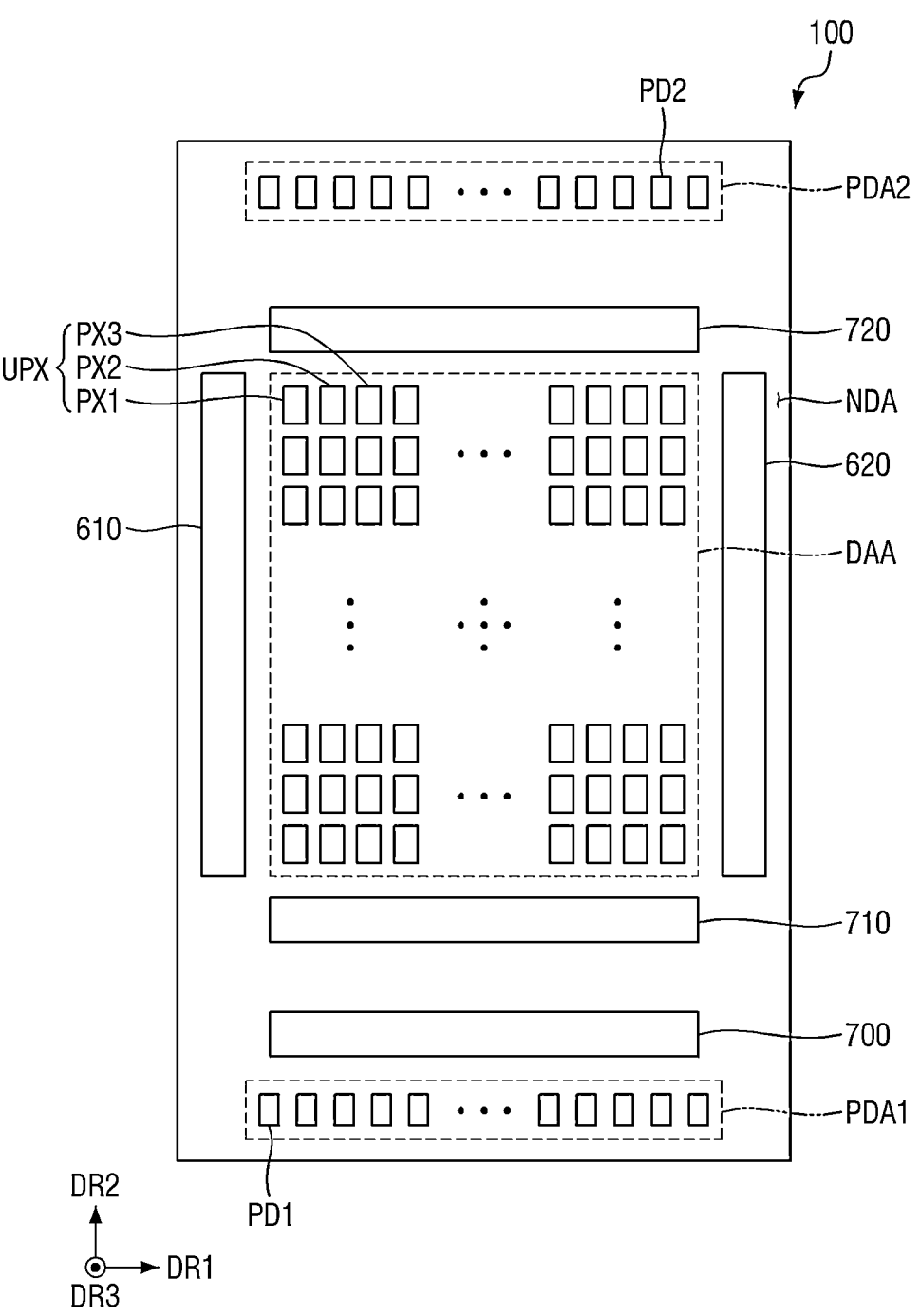
FIG. 4 is a layout diagram illustrating an example of a display panel according to an exemplary embodiment.

FIG. 4 is a layout diagram illustrating an example of a display panel 100 according to an exemplary embodiment.

Referring to FIG. 4, the display area DAA of the display panel 100 according to an exemplary embodiment includes a plurality of unit pixels UPX arranged in a matrix form. The non-display area NDA of the display panel 100 according to an exemplary embodiment includes the scan driver 610, the emission driver 620, the data driver 700, a first distribution circuit 710, a second distribution circuit 720, a first pad unit PDA1, and a second pad unit PDA2.

The scan driver 610 may be disposed on a first side of the display area DAA, and the emission driver 620 may be disposed on a second side of the display area DAA opposite to the first side. For example, the scan driver 610 may be disposed on one side of the display area DAA in the first direction DR1, and the emission driver 620 may be disposed on the other side of the display area DAA in the first direction DR1. For example, the scan driver 610 may be disposed on the left side of the display area DAA, and the emission driver 620 may be disposed on the right side of the display area DAA. However, an exemplary embodiment of the present disclosure is not limited thereto, and the scan drivers 610 and the emission drivers 620 may be disposed on both the first and second sides of the display area DAA.

The first pad unit PDA1 may include a plurality of first pads PD1 connected to pads or bumps of the circuit board 300 through a conductive adhesive member. The first pad unit PDA1 may be disposed on a third side of the display area DAA. For example, the first pad unit PDA1 may be disposed on one side of the display area DAA in the second direction DR2. The first pad unit PDA1 may be disposed outside the data driver 700 in the second direction DR2. For example, the first pad unit PDA1 may be disposed closer to an edge of the display panel 100 than the data driver 700.

The second pad unit PDA2 may include a plurality of second pads PD2 corresponding to inspection pads that inspect whether or not the display panel 100 operates normally. The plurality of second pads PD2 may be connected to a jig or a probe pin or connected to a circuit board for inspection in an inspection process. The circuit board for inspection may be a printed circuit board made of a rigid material or a flexible printed circuit board made of a flexible material.

The first distribution circuit 710 distributes data voltages applied through the first pad unit PDA1 to a plurality of data lines DL. For example, the first distribution circuit 710 may distribute data voltages applied through one first pad PD1 of the first pad unit PDA1 to P data lines DL (P is a positive integer of 2 or more), and for this reason, the number of first pads PD1 may be reduced. The first distribution circuit 710 may be disposed on the third side of the display area DAA of the display panel 100. For example, the first distribution circuit 710 may be disposed on one side of the display area DAA in the second direction DR2, e.g., the first distribution circuit 710 may be disposed on the lower side of the display area DAA.

The second distribution circuit 720 distributes signals applied through the second pad unit PDA2 to the scan driver 610, the emission driver 620, and the data lines DL. The second pad unit PDA2 and the second distribution circuit 720 may be components for inspecting operation of the pixels PX in the display area DAA. The second distribution circuit 720 may be disposed on a fourth side of the display area DAA of the display panel 100. For example, the second distribution circuit 720 may be disposed on an opposite side of the display area DAA in the second direction DR2, e.g., the second distribution circuit 720 may be disposed on the upper side of the display area DAA.

Figure 5:
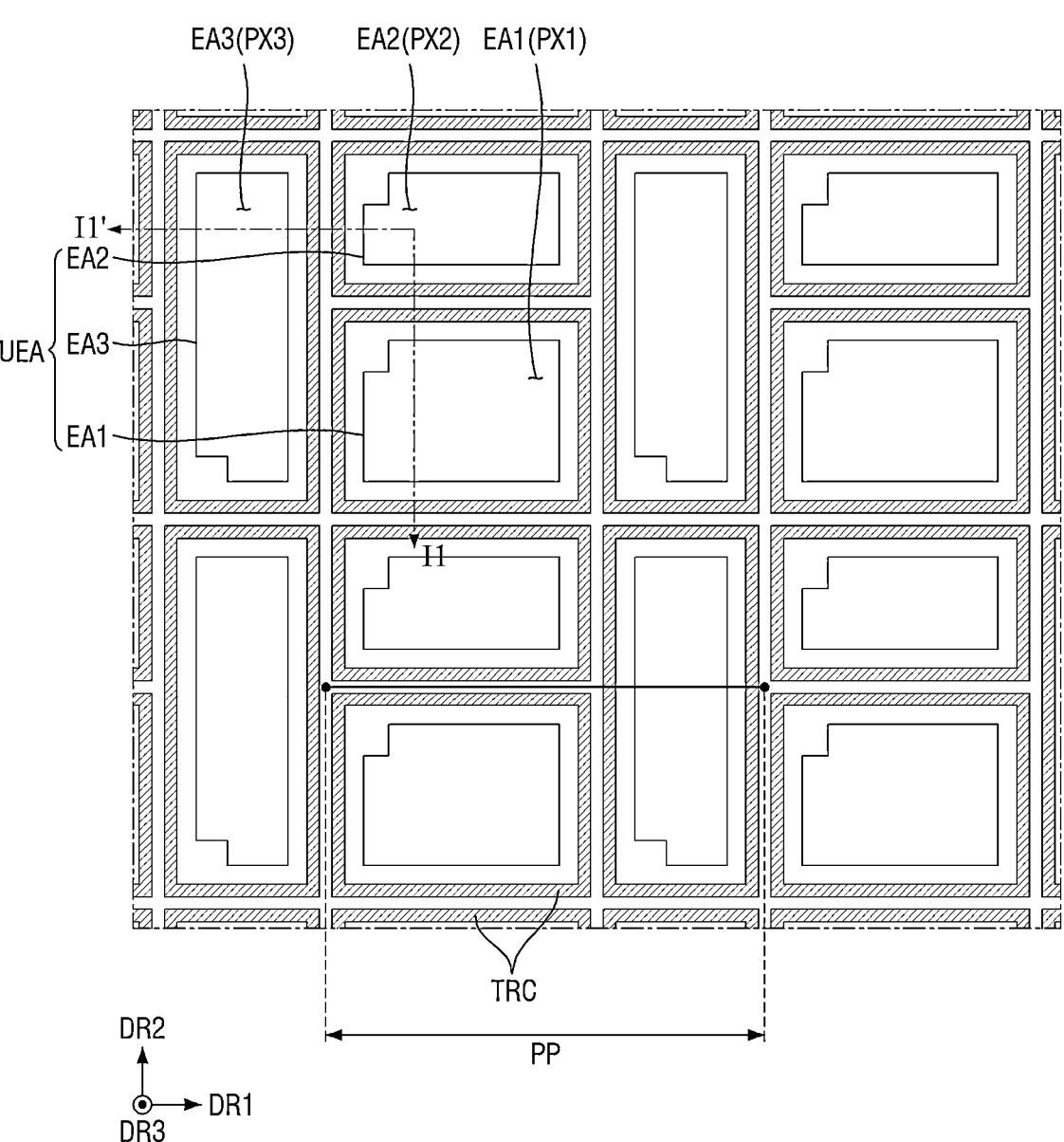
FIGS. 5 and 6 are layout diagrams illustrating pixels of a display area of FIG. 4 according to an exemplary embodiment.
Figure 6:
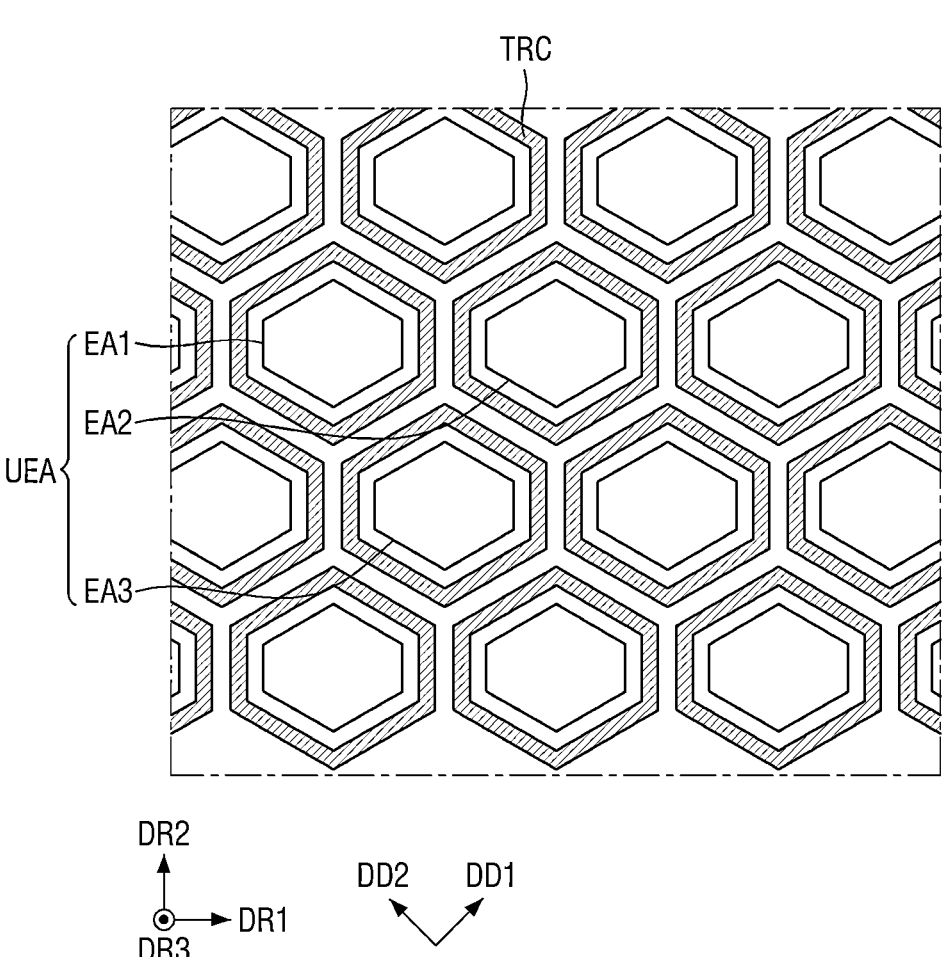

FIGS. 5 and 6 are layout diagrams illustrating exemplary embodiments of the display area DAA of FIG. 4.

Referring to FIGS. 5 and 6, each of the plurality of unit pixels UPX includes a first emission area EA1 that is an emission area of the first pixel PX1, a second emission area EA2 that is an emission area of the second pixel PX2, and a third emission area EA3 that is an emission area of the third pixel PX3. In other words, the unit pixel may include a unit emission area, and this unit emission area UEA includes the above-described first emission area EA1, second emission area EA2, and third emission area EA3.

Referring to FIGS. 5 and 6, each of the plurality of unit pixels UPX includes a first emission area EA1 that is an emission area of the first pixel PX1, a second emission area EA2 that is an emission area of the second pixel PX2, and a third emission area EA3 that is an emission area of the third pixel PX3.

Each of the first emission area EA1, the second emission area EA2, and the third emission area EA3 may have a predetermined shape, e.g., a polygonal shape, a circular shape, an elliptical shape, or an irregular shape in plan view.

The maximum length of the third emission area EA3 in the first direction DR1 may be less than the maximum length of the first emission area EA1 in the first direction DR1 and the maximum length of the second emission area EA2 in the first direction DR1. In one embodiment, the maximum length of the first emission area EA1 in the first direction DR1 and the maximum length of the second emission area EA2 in the first direction DR1 may be substantially the same as each other.

The maximum length of the third emission area EA3 in the second direction DR2 may be greater than the maximum length of the first emission area EA1 in the second direction DR2 and the maximum length of the second emission area EA2 in the second direction DR2. The maximum length of the first emission area EA1 in the second direction DR2 may be greater than the maximum length of the second emission area EA2 in the second direction DR2. The maximum length of the first emission area EA1 in the second direction DR2 may be less than the maximum length of the third emission area EA3 in the second direction DR2.

Each of the first emission area EA1, the second emission area EA2, and the third emission area EA3 may have a hexagonal shape including six straight lines, in plan view, as illustrated in FIG. 6, but an exemplary embodiment of the present disclosure is not limited thereto. Each of the first emission area EA1, the second emission area EA2, and the third emission area EA3 may have polygonal shapes other than the hexagonal shape, a circular shape, an elliptical shape, or an irregular shape in plan view.

As illustrated in FIG. 5, in each of the plurality of unit pixels UPX, the first emission area EA1 and the second emission area EA2 may be adjacent to each other in the second direction DR2. In addition, the first emission area EA1 and the third emission area EA3 may be adjacent to each other in the first direction DR1. In addition, the second emission area EA2 and the third emission area EA3 may be adjacent to each other in the first direction DR1. In one embodiment, the area of the first emission area EA1, the area of the second emission area EA2, and the area of the third emission area EA3 may be different from each other.

In one embodiment, as illustrated in FIG. 6, the first emission area EA1 and the second emission area EA2 may be adjacent to each other in the first direction DR1, but the second emission area EA2 and the third emission area EA3 may be adjacent to each other in a first diagonal direction DD1, and the first emission area EA1 and the third emission area EA3 may be adjacent to each other in a second diagonal direction DD2. The first diagonal direction DD1 is a direction between the first direction DR1 and the second direction DR2 and may refer to a direction inclined at a predetermined angle (e.g., 45°) with respect to the first direction DR1 and the second direction DR2, and the second diagonal direction DD2 may be a direction orthogonal to the first diagonal direction DD1.

The first emission area EA1 may emit light of a first color, the second emission area EA2 may emit light of a second color, and the third emission area EA3 may emit light of a third color. Here, the light of the first color may be light of a blue wavelength band, the light of the second color may be light of a green wavelength band, and the light of the third color may be light of a red wavelength band. For example, the blue wavelength band may indicate that a main peak wavelength of the light is included in a wavelength band of approximately 370 nm to 460 nm. The green wavelength band may indicate that a main peak wavelength of the light is included in a wavelength band of approximately 480 nm to 560 nm. The red wavelength band may indicate that a main peak wavelength of the light is included in a wavelength band of approximately 600 nm and 750 nm. The emission areas may be arranged differently in another embodiment.

It has been illustrated in FIGS. 5 and 6 that each of the plurality of unit pixels UPX includes three emission areas EA1, EA2, and EA3, but an exemplary embodiment of the present disclosure is not limited thereto. For example, in one embodiment each of the plurality of unit pixels UPX may include four emission areas, two of which emit light of a same color or which emit white light.

In addition, an arrangement of the emission areas of the plurality of unit pixels UPX is not limited to those illustrated in FIGS. 5 and 6. For example, the emission areas of the plurality of unit pixels UPX may be disposed in a stripe structure in which the emission areas are arranged in the first direction DR1, a PenTile® structure in which the emission areas have a diamond arrangement, or a hexagonal structure in which emission areas having a hexagonal shape in plan view are arranged as illustrated in FIG. 6.

Figure 7:
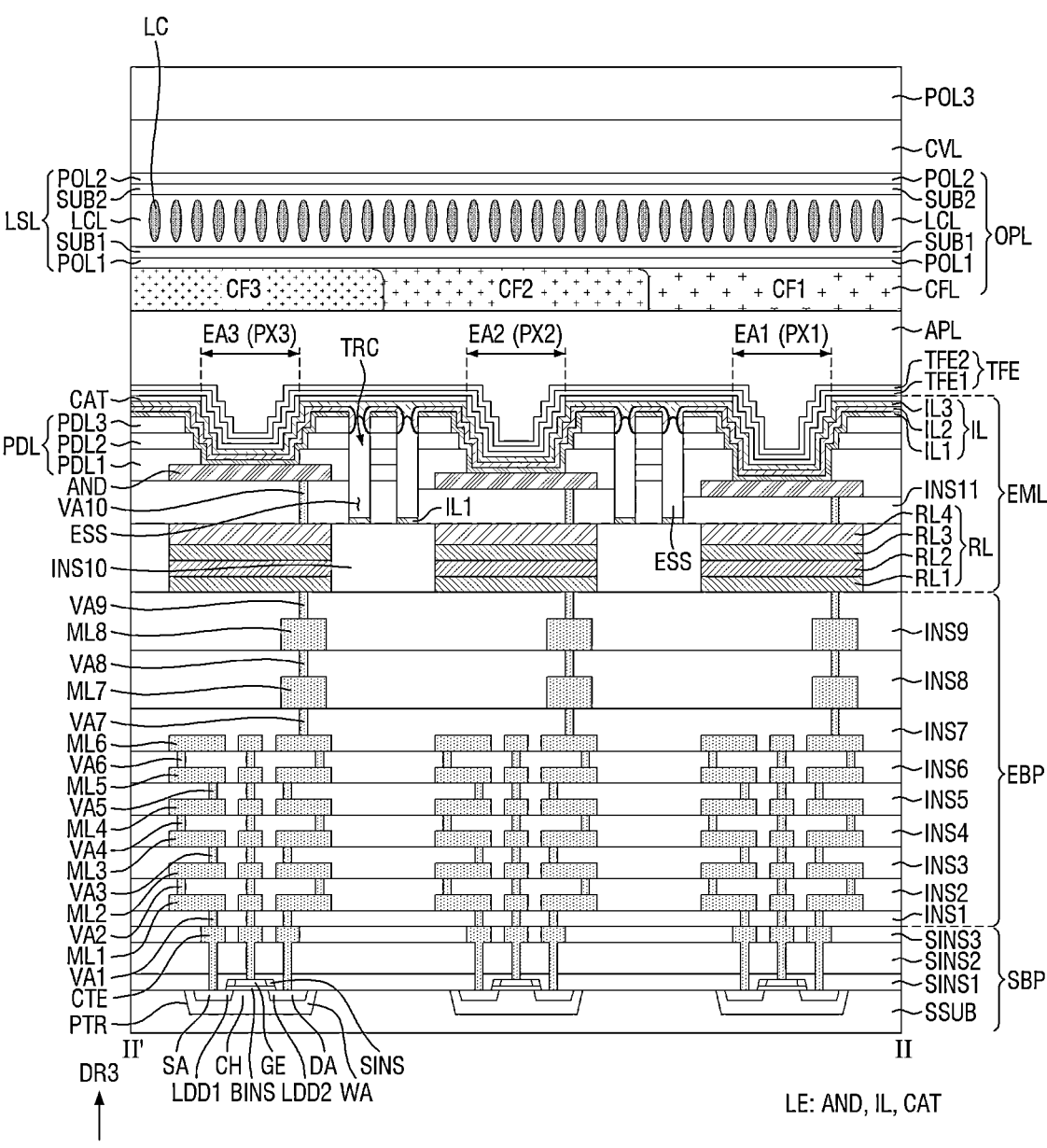
FIG. 7 is a cross-sectional view illustrating an example of the display panel taken along line I1-I1' of FIG. 5 according to an exemplary embodiment.

FIG. 7 is a cross-sectional view illustrating an example of the display panel 100 taken along line I1-I1' of FIG. 5 according to an embodiment.

Referring to FIG. 7, the display panel 100 includes a semiconductor backplane SBP, a light emitting element backplane EBP, a display element layer EML, an encapsulation layer TFE, an optical layer OPL, a cover layer CVL, and a polarizing plate POL3.

The semiconductor backplane SBP may include a semiconductor substrate SSUB including a plurality of pixel transistors, a plurality of semiconductor insulating films covering the plurality of pixel transistors, and a plurality of contact terminals CTE electrically connected to the plurality of pixel transistors, respectively. The plurality of pixel transistors may be, for example, the first to sixth transistors T1 to T6 described with reference to FIG. 3.

The semiconductor substrate SSUB may be, for example, a silicon substrate, a germanium substrate, or a silicon-germanium substrate. The semiconductor substrate SSUB may be a substrate doped with first-type impurities. A plurality of well regions WA may be disposed in an upper surface of the semiconductor substrate SSUB. The plurality of well regions WA may be regions doped with second-type impurities. The second-type impurities may be different from the first-type impurities described above. For example, when the first-type impurities are p-type impurities, the second-type impurities may be n-type impurities. In one embodiment, when the first-type impurities are n-type impurities, the second-type impurities may be p-type impurities.

Each of the plurality of well regions WA includes a source region SA corresponding to a source electrode of the pixel transistor PTR, a drain region DA corresponding to a drain electrode of the pixel transistor PTR, and a channel region CH disposed between the source region SA and the drain region DA.

A bottom insulating film BINS may be disposed between a gate electrode GE and the well region WA. Side surface insulating films SINS may be disposed on side surfaces of the gate electrode GE. The side surface insulating films SINS may be disposed on the bottom insulating film BINS.

Each of the source region SA and the drain region DA may be a region doped with the first-type impurities. A gate electrode GE of the pixel transistor PTR may overlap the well region WA in the third direction DR3. The channel region CH may overlap the gate electrode GE in the third direction DR3. The source region SA may be disposed on one side of the gate electrode GE, and the drain region SA may be disposed on the other side of the gate electrode GE.

Each of the plurality of well regions WA further includes a first low-concentration impurity region LDD1 disposed between the channel region CH and the source region SA and a second low-concentration impurity region LDD2 disposed between the channel region CH and the drain region DA. The first low-concentration impurity region LDD1 may be a region having a lower impurity concentration than the source region SA due to the bottom insulating film BINS. The second low-concentration impurity region LDD2 may be a region having a lower impurity concentration than the drain region DA due to the bottom insulating film BINS. The distance between the source region SA and the drain region DA may increase by the first low-concentration impurity region LDD1 and the second low-concentration impurity region LDD2. Therefore, the length of the channel region CH of each of the pixel transistors PTR may increase. As a result, punch-through and hot carrier phenomena caused by a short channel may be prevented.

A first semiconductor insulating film SINS1 may be disposed on the semiconductor substrate SSUB. The first semiconductor insulating film SINS1 may be formed, for example, as a silicon carbonitride (SiCN) or silicon oxide ($SiO_x$)-based inorganic film, but an exemplary embodiment of the present disclosure is not limited thereto.

A second semiconductor insulating film SINS2 may be disposed on the first semiconductor insulating film SINS1. The second semiconductor insulating film SINS2 may be formed from the same or different material from the first semiconductor insulating film SINS1. For example, the second semiconductor insulating firm SINS2 may be formed as a silicon oxide ($SiO_x$)-based inorganic film, but an exemplary embodiment of the present disclosure is not limited thereto.

The plurality of contact terminals CTE may be disposed on the second semiconductor insulating film SINS2. The plurality of contact terminals CTE may be connected to corresponding ones of the gate electrode GE, the source region SA, and the drain region DA of the pixel transistors PTR. The connections may be made through holes penetrating through the first semiconductor insulating film SINS1 and the second semiconductor insulating film SINS2. Each of the plurality of contact terminals CTE may be made of a predetermined conductive material, e.g., any one of copper (Cu), aluminum (Al), tungsten (W), molybdenum (Mo), chromium (Cr), gold (Au), titanium (Ti), nickel (Ni), and neodymium (Nd), or alloys thereof.

A third semiconductor insulating film SINS3 may be disposed in a same layer as the plurality of contact terminals CTE, e.g., the third semiconductor insulating film SINS3 may be disposed on side surfaces of each of the plurality of contact terminals CTE. An upper surface of each of the plurality of contact terminals CTE may be exposed without being covered by the third semiconductor insulating film SINS3. The third semiconductor insulating film SINS3 may be formed as a silicon oxide ($SiO_x$)-based inorganic film, but an exemplary embodiment of the present disclosure is not limited thereto.

In one embodiment, the semiconductor substrate SSUB may be replaced with a glass substrate or a polymer resin substrate such as a polyimide substrate. In this case, thin film transistors may be disposed on the glass substrate or the polymer resin substrate. The glass substrate may be a rigid substrate that does not bend, and the polymer resin substrate may be a flexible substrate that bends, rolls, or curves.

The light emitting element backplane EBP includes a plurality of conductive layers ML1 to ML8, a plurality of vias VA1 to VA9, and a plurality of insulating films INS1 to INS9. In addition, the light emitting element backplane EBP includes a plurality of insulating films INS1 to INS9 disposed between first to eighth conductive layers ML1 to ML8.

The first to eighth conductive layers ML1 to ML8 serve to implement a circuit of the first pixel PX1 illustrated in FIG. 3 by connecting the plurality of contact terminals CTE exposed from the semiconductor backplane SBP to each other. For example, only the first to sixth transistors T1 to T6 are formed in the semiconductor backplane SBP, and the connection between the first to sixth transistors T1 to T6 and the formation of the first capacitor CP1 and the second capacitor CP2 are performed through the first to eighth conductive layers ML1 to ML8. In addition, the connection between a drain region corresponding to a drain electrode of the fourth transistor T4, a source region corresponding to a source electrode of the fifth transistor T5, and a first electrode of a light emitting element LE is also performed through the first to eighth conductive layers ML1 to ML8.

A first insulating film INS1 may be disposed on the semiconductor backplane SBP. Each of first vias VA1 may penetrate through the first film INS1 to be connected to the contact terminal CTE exposed from the semiconductor backplane SBP. Each of the first conductive layers ML1 may be disposed on the first insulating film INS1 and may be connected to the first via VA1.

A second insulating film INS2 may be disposed on the first insulating film INS1 and the first conductive layers ML1. Each of second vias VA2 may penetrate through the second insulating film INS2 to be connected to the exposed first conductive layer ML1. Each of the second conductive layers ML2 may be disposed on the second insulating film INS2 and be connected to the second via VA2.

A third insulating film INS3 may be disposed on the second insulating film INS2 and the second conductive layers ML2. Each of third vias VA3 may penetrate through the third insulating film INS3 to be connected to the exposed second conductive layer ML2. Each of the third conductive layers ML3 may be disposed on the third insulating film INS3 and be connected to the third via VA3.

A fourth insulating film INS4 may be disposed on the third insulating film INS3 and the third conductive layer ML3. Each of fourth vias VA4 may penetrate through the fourth insulating film INS4 to be connected to the exposed third conductive layer ML3. Each of the fourth conductive layers ML4 may be disposed on the fourth insulating film INS4 and be connected to the fourth via VA4.

A fifth insulating film INS4 may be disposed on the fourth insulating film INS4 and the fourth conductive layers ML4. Each of fifth vias VA5 may penetrate through the fifth film INS5 to be connected to the exposed fourth conductive layer ML4. Each of the fifth conductive layers ML5 may be disposed on the fifth insulating film INS5 and be connected to the fifth via VA5.

A sixth insulating film INS6 may be disposed on the fifth insulating film INS5 and the fifth conductive layer ML5. Each of sixth vias VA6 may penetrate through the sixth insulating film INS6 to be connected to the exposed fifth conductive layer ML5. Each of the sixth conductive layers ML6 may be disposed on the sixth insulating film INS6 and be connected to the sixth via VA6.

A seventh insulating film INS7 may be disposed on the sixth insulating film INS6 and the sixth conductive layer ML6. Each of seventh vias VA7 may penetrate through the seventh insulating film INS7 to be connected to the exposed sixth conductive layer ML6. Each of the seventh conductive layers ML7 may be disposed on the seventh insulating film INS7 and be connected to the seventh via VA7.

An eighth insulating film INS8 may be disposed on the seventh insulating film INS7 and the seventh conductive layer ML7. Each of eighth vias VA8 may penetrate through the eighth insulating film INS8 to be connected to the exposed seventh conductive layer ML7. Each of the eighth conductive layers ML8 may be disposed on the eighth insulating film INS8 and be connected to the eighth via VA8.

The first to eighth conductive layers ML1 to ML8 and the first to eighth vias VA1 to VA8 may be made of substantially the same material. For example, each of the first to eighth conductive layers ML1 to ML8 and the first to eighth vias VA1 to VA8 may be made of any one of copper (Cu), aluminum (Al), tungsten (W), molybdenum (Mo), chromium (Cr), gold (Au), titanium (Ti), nickel (Ni), and neodymium (Nd), or alloys thereof. The first to eighth vias VA1 to VA8 may be made of substantially the same material. For example, the first to eighth insulating films INS1 to INS8 may be formed as silicon oxide ($SiO_x$)-based inorganic films, but an exemplary embodiment of the present disclosure is not limited thereto.

Each of a thickness of the first conductive layer ML1, a thickness of the second conductive layer ML2, a thickness of the third conductive layer ML3, a thickness of the fourth conductive layer ML4, a thickness of the fifth conductive layer ML5, and a thickness of the sixth conductive layer ML6 may be greater than each of a thickness of the first via VA1, a thickness of the second via VA2, a thickness of the third via VA3, a thickness of the fourth via VA4, a thickness of the fifth via VA5, and a thickness of the sixth via VA6. Each of the thickness of the second conductive layer ML2, the thickness of the third conductive layer ML3, the thickness of the fourth conductive layer ML4, the thickness of the fifth conductive layer ML5, and the thickness of the sixth conductive layer ML6 may be greater than the thickness of the first conductive layer ML1. The thickness of the second conductive layer ML2, the thickness of the third conductive layer ML3, the thickness of the fourth conductive layer ML4, the thickness of the fifth conductive layer ML5, and the thickness of the sixth conductive layer ML6 may be substantially the same as each other. For example, the thickness of the first conductive layer ML1 may be approximately 1360 Å, each of the thickness of the second conductive layer ML2, the thickness of the third conductive layer ML3, the thickness of the fourth conductive layer ML4, the thickness of the fifth conductive layer ML5, and the thickness of the sixth conductive layer ML6 may be approximately 1440 Å, and each of the thickness of the first via VA1, the thickness of the second via VA2, the thickness of the third via VA3, the thickness of the fourth via VA4, the thickness of the fifth via VA5, and the thickness of the sixth via VA6 may be approximately 1150 Å.

As further shown in FIG. 7, each of a thickness of the seventh conductive layer ML7 and a thickness of the eighth conductive layer ML8 may be greater than each of the thickness of the first conductive layer ML1, the thickness of the second conductive layer ML2, the thickness of the third conductive layer ML3, the thickness of the fourth conductive layer ML4, the thickness of the fifth conductive layer ML5, and the thickness of the sixth conductive layer ML6. Each of the thickness of the seventh conductive layer ML7 and the eighth conductive layer ML8 may be greater than each of a thickness of the seventh via VA7 and a thickness of the eighth via VA8. Each of the thickness of the seventh via VA7 and the thickness of the eighth via VA8 may be greater than each of the thickness of the first via VA1, the thickness of the second via VA2, the thickness of the third via VA3, the thickness of the fourth via VA4, the thickness of the fifth via VA5, and the thickness of the sixth via VA6. The thickness of the seventh conductive layer ML7 and the thickness of the eighth conductive layer ML8 may be substantially the same as each other. For example, each of the thickness of the seventh conductive layer ML7 and the thickness of the eighth conductive layer ML8 may be approximately 9000 Å. Each of the thickness of the seventh via VA7 and the thickness of the eighth via VA8 may be approximately 6000 Å.

A ninth insulating film INS9 may be disposed on the eighth insulating film INS8 and the eighth conductive layer ML8. The ninth insulating film INS9 may be formed as a silicon oxide $(SiO_x)$-based inorganic film, but an exemplary embodiment of the present disclosure is not limited thereto.

Each of ninth vias VA9 may penetrate through the ninth insulating film INS9 to be connected to the exposed eighth conductive layer ML8. Each of the ninth vias VA9 may, for example, be made of any one of copper (Cu), aluminum (Al), tungsten (W), molybdenum (Mo), chromium (Cr), gold (Au), titanium (Ti), nickel (Ni), and neodymium (Nd), or alloys thereof. A thickness of the ninth via VA9 may be approximately 16500 Å.

The display element layer EML may be disposed on the light emitting element backplane EBP. The display element layer EML may include a reflective electrode layer RL, tenth and eleventh insulating films INS10 and INS11, tenth vias VA10, light emitting elements LE each including a first electrode AND, a light emitting stack IL, and a second electrode CAT, a pixel defining film PDL, and a plurality of trenches TRC.

The reflective electrode layer RL may be disposed on the ninth insulating film INS9. The reflective electrode layer RL may include one or more reflective electrodes RL1, RL2, RL3, and RL4. For example, the reflective electrode layer RL may include first to fourth reflective electrodes RL1, RL2, RL3, and RLA as illustrated in FIG. 7, however the reflective electrode layer RL may include a different number of reflective electrodes in another embodiment.

Each of the first reflective electrodes RL1 of the pixels PX1 to PX3 may be disposed on the ninth insulating film INS9 and may be connected to corresponding ones of the ninth vias VA9. Each of the first reflective electrodes RL1 may be made of, for example, any one of copper (Cu), aluminum (Al), tungsten (W), molybdenum (Mo), chromium (Cr), gold (Au), titanium (Ti), nickel (Ni), and neodymium (Nd), or alloys thereof. In one embodiment, each of the first reflective electrodes RL1 may include titanium nitride (TiN).

Each of the second reflective electrodes RL2 of the pixels PX1 to PX3 may be disposed on corresponding ones of the first reflective electrodes RL1. Each of the second reflective electrodes RL2 may, for example, be made of any one of copper (Cu), aluminum (Al), tungsten (W), molybdenum (Mo), chromium (Cr), gold (Au), titanium (Ti), nickel (Ni), and neodymium (Nd), or alloys thereof. In one embodiment, each of the second reflective electrodes RL2 may include aluminum (Al).

Each of the third reflective electrodes RL3 of the pixels PX1 to PX3 may be disposed on corresponding ones of the second reflective electrode RL2. Each of the third reflective electrodes RL3 may, for example, be made of any one of copper (Cu), aluminum (Al), tungsten (W), molybdenum (Mo), chromium (Cr), gold (Au), titanium (Ti), nickel (Ni), and neodymium (Nd), or alloys thereof. In one embodiment, each of the third reflective electrodes RL3 may include titanium nitride (TiN).

Each of the fourth reflective electrodes RL4 of the pixels PX1 to PX3 may be disposed on corresponding ones of the third reflective electrodes RL3. Each of the fourth reflective electrodes RL4 may, for example, be made of any one of copper (Cu), aluminum (Al), tungsten (W), molybdenum (Mo), chromium (Cr), gold (Au), titanium (Ti), nickel (Ni), and neodymium (Nd), or alloys thereof. In one embodiment, each of the fourth reflective electrodes RL4 may include titanium (Ti).

The second reflective electrodes RL2 may substantially reflect light from the light emitting elements LE. As a result, in one embodiment the thickness of the second reflective electrode RL2 may be greater than a thickness of the first reflective electrode RL1, a thickness of the third reflective electrode RL3, and a thickness of the fourth reflective electrode RL4. For example, the thickness of the first reflective electrode RL1, the third reflective electrode RL3, and the fourth reflective electrode RL4 may be approximately 100 Å, and the thickness of the second reflective electrode RL2 may be approximately 850 Å.

The tenth insulating film INS10 may be disposed on the ninth insulating film INS9. The tenth insulating film INS10 may be disposed between adjacent ones of the reflective electrode layers RL in a horizontal direction. In one embodiment, the tenth insulating film INS10 may be disposed on the reflective electrode layer RL in the third pixel PX3. The tenth insulating film INS10 may be formed as a silicon oxide ($SiO_x$)-based inorganic film, but an exemplary embodiment of the present disclosure is not limited thereto.

The eleventh insulating film INS11 may be disposed on the tenth insulating film INS10 and the reflective electrode layer RL. The eleventh insulating film INS11 may be formed as a silicon oxide ($SiO_x$)-based inorganic film, but an exemplary embodiment of the present disclosure is not limited thereto. The tenth insulating film INS10 and the eleventh insulating film INS11 may be optical auxiliary layers through which light reflected by the reflective electrode layer RL among light emitted from the light emitting elements LE passes.

In order to adjust a resonance distance of the light emitted from the light emitting elements LE in at least one of the first pixel PX1, the second pixel PX2, or the third pixel PX3, in one embodiment the tenth insulating film INS10 and eleventh insulating film INS11 may not be disposed below the first electrode AND of the first pixel PX1. Additionally, in one embodiment, the first electrode AND of the first pixel PX1 may be directly disposed on the reflective electrode layer RL. The eleventh insulating film INS11 may be disposed below the first electrode AND of the second pixel PX2. The tenth insulating film INS10 and the eleventh insulating film INS11 may be disposed below the first electrode AND of the third pixel PX3.

In summary, the distance between the first electrode AND and the reflective electrode layer RL may be different in each of the first pixel PX1, the second pixel PX2, and the third pixel PX3. For example, in order to adjust the distance from the reflective electrode layer RL to the second electrode CAT according to a main wavelength of light emitted from each of the first pixel PX1, the second pixel PX2, and third the pixel PX3, the presence or absence of the tenth insulating film INS10 and the eleventh insulating film INS11 may be set in each of the first pixel PX1, the second pixel PX2, and the third pixel PX3. For example, it has been illustrated in FIG. 7 that the distance between the first electrode AND and the reflective electrode layer RL in the third pixel PX3 is greater than a distance between the first electrode AND and the reflective electrode layer RL in the second pixel PX2 and the distance between the first electrode AND and the reflective electrode layer RL in the first pixel PX1. Moreover, the distance between the first electrode AND and the reflective electrode layer RL in the second pixel PX2 is greater than the distance between the first electrode AND and the reflective electrode layer RL in the first pixel PX1, but an exemplary embodiment of the present disclosure is not limited thereto. For example, as shown, the height of the first electrode AND may progressively decrease from the third pixel PX3 to the first pixel PX1.

In addition, the tenth insulating film INS10 and the eleventh insulating film INS11 have been illustrated in an exemplary embodiment of the present disclosure, but in one embodiment a twelfth insulating film disposed below the first electrode AND of the first pixel PX1 may be added. In this case, the eleventh insulating film INS11 and the twelfth insulating film INS12 may be disposed below the first electrode AND of the second pixel PX2, and the tenth insulating film INS10, the eleventh insulating film INS11, and the twelfth insulating film INS12 may be disposed below the first electrode AND of the third pixel PX3.

Each of the tenth vias VA10 may penetrate through the tenth insulating film INS10 and/or the eleventh insulating film INS11 in the second pixel PX2 and the third pixel PX3 to be electrically connected to the exposed fourth reflective electrode RL4. Each of the tenth vias VA10 may, for example, be made of any one of copper (Cu), aluminum (Al), tungsten (W), molybdenum (Mo), chromium (Cr), gold (Au), titanium (Ti), nickel (Ni), and neodymium (Nd), or alloys thereof. In one embodiment, the thickness of the tenth via VA10 in the second pixel PX2 may be less than the thickness of the tenth via VA10 in the third pixel PX3.

The first electrode AND of each of the light emitting elements LE of the first to third pixels PX1 to PX3 may be at least partially disposed on at least one of the tenth insulating film INS10 or eleventh insulating film INS11, and may be connected to the tenth via VA10. The first electrode AND of each of the light emitting elements LE may be connected to the drain region DA or the source region SA of the pixel transistor PTR through the tenth via VA10, the first to fourth reflective electrodes RL1 to RL4, the first to ninth vias VA1 to VA9, the first to eighth conductive layers ML1 to ML8, and the contact terminal CTE. The first electrode AND of each of the light emitting elements LE may, for example, be made of any one of copper (Cu), aluminum (Al), tungsten (W), molybdenum (Mo), chromium (Cr), gold (Au), titanium (Ti), nickel (Ni), and neodymium (Nd), or alloys thereof. For example, the first electrode AND of each of the light emitting elements LE may be made of titanium nitride (TiN).

The pixel defining film PDL may be disposed on a partial area of the first electrode AND of the light emitting elements LE of the pixels PX1 to PX3. The pixel defining film PDL may cover an edge of the first electrode AND of each of the light emitting elements LE. The pixel defining film PDL serves to partition the first emission areas EA1, the second emission areas EA2, and the third emission areas EA3.

The first emission area EA1 may be defined as an area where the first electrode AND, the light emitting stack IL, and the second electrode CAT are sequentially stacked in the first pixel PX1 to emit light. The second emission area EA2 may be defined as an area where the first electrode AND, the light emitting stack IL, and the second electrode CAT are sequentially stacked in the second pixel PX2 to emit light. The third emission area EA3 may be defined as an area where the first electrode AND, the light emitting stack IL, and the second electrode CAT are sequentially stacked in the third pixel PX3 to emit light.

In one embodiment, the pixel defining film PDL may include first to third pixel defining films PDL1, PDL2, and PDL3. The first pixel defining film PDL1 may be disposed on the edge of the first electrode AND of each of the light emitting elements LE. The second pixel defining film PDL2 may be disposed on the first pixel defining film PDL1. The third pixel defining film PDL3 may be disposed on the second pixel defining film PDL2. The first pixel defining film PDL1, the second pixel defining film PDL2, and the third pixel defining film PDL3 may be formed as silicon oxide ($SiO_x$)-based inorganic films, but an exemplary embodiment of the present disclosure is not limited thereto. The thickness of the first pixel defining film PDL1, the thickness of the second pixel defining film PDL2, and the thickness of the third pixel defining film PDL3 may is the same or different from one another. In one embodiment, the thicknesses of the first pixel defining film PDL1, the second pixel defining film PDL2, and the third pixel defining film PDL3 may be approximately 500 Å.

When the first pixel defining film PDL1, the second pixel defining film PDL2, and the third pixel defining film PDL3 are formed as one pixel defining film, the height of the one pixel defining film increases. As a result, a first encapsulation inorganic film TFE1 may be disconnected due to step coverage. The step coverage may refer to a ratio of a degree at which a thin film is coated on an inclined portion to a degree at which a thin film is coated on a flat portion. The lower the step coverage, the more likely it is that the thin film will be disconnected at the inclined portion.

Therefore, in order to prevent the first encapsulation inorganic film TFE1 from being disconnected due to the step coverage, the first pixel defining film PDL1, the second pixel defining film PDL2, and the third pixel defining film PDL3 may have a cross-sectional structure with steps formed in a staircase shape. For example, the width of the first pixel defining film PDL1 may be greater than the width of the second pixel defining film PDL2 and the width of the third pixel defining film PDL3. Additionally, the width of the second pixel defining film PDL2 may be greater than the width of the third pixel defining film PDL3. The width of the first pixel defining film PDL1 refers to a length, in the horizontal direction, of the first pixel defining film PDL1 defined by the first direction DR1 and the second direction DR2.

As previously mentioned, a plurality of trenches TRC may also be included. Each of the plurality of trenches TRC may penetrate through the first pixel defining film PDL1, the second pixel defining film PDL2, and the third pixel defining film PDL3. In addition, each of the plurality of trenches TRC may penetrate through the eleventh insulating film INS11. In each of the plurality of trenches TRC, the tenth insulating film INS10 may have a shape in which a portion thereof is trenched.

At least one trench TRC may be disposed between adjacent ones of the pixels PX1, PX2, and PX3. It has been illustrated in FIG. 7 that two trenches TRC are disposed between adjacent ones of the pixels PX1, PX2, and PX3, but an exemplary embodiment of the present disclosure is not limited thereto.

The light emitting stack IL may include a plurality of intermediate layers. It has been illustrated in FIG. 7 that the light emitting stack IL has a structure including a first stack layer IL1, a second stack layer IL2, and a third stack layer IL3 arranged in tandem, but an exemplary embodiment of the present disclosure is not limited thereto. For example, the light emitting stack IL may have a two-tandem structure including two intermediate layers.

In the three-tandem structure, the light emitting stack IL may have a tandem structure including a plurality of stack layers IL1, IL2, and IL3 emitting different light. For example, the light emitting stack IL may include a first stack layer IL1 emitting light of a first color, a second stack layer IL2 emitting light of a third color, and a third stack layer IL3 emitting light of a second color. The first stack layer IL1, the second stack layer IL2, and the third stack layer IL3 may be sequentially stacked.

The first stack layer IL1 may have a structure in which a first hole transporting layer, a first organic light emitting layer emitting the light of the first color, and a first electron transporting layer are sequentially stacked. The second stack layer IL2 may have a structure in which a second hole transporting layer, a second organic light emitting layer emitting the light of the third color, and a second electron transporting layer are sequentially stacked. The third stack layer IL3 may have a structure in which a third hole transporting layer, a third organic light emitting layer emitting the light of the second color, and a third electron transporting layer are sequentially stacked.

A first charge generation layer for supplying charges to the second stack layer IL2 and supplying electrons to the first stack layer IL1 may be disposed between the first stack layer IL1 and the second stack layer IL2. The first charge generation layer may include an N-type charge generation layer supplying electrons to the first stack layer IL1 and a P-type charge generation layer supplying holes to the second stack layer IL2. The N-type charge generation layer may include a dopant of a metal material.

A second charge generation layer for supplying charges to the third stack layer IL3 and supplying electrons to the second stack layer IL2 may be disposed between the second stack layer IL2 and the third stack layer IL3. The second charge generation layer may include an N-type charge generation layer supplying electrons to the second stack layer IL2 and a P-type charge generation layer supplying holes to the third stack layer IL3.

The first stack layer IL1 may be disposed on the first electrodes AND and the pixel defining film PDL, and may be disposed on a bottom surface of each of the trenches TRC. Due to the trenches TRC, the first stack layer IL1 may be disconnected between adjacent ones of the pixels PX1, PX2, and PX3. The second stack layer IL2 may be disposed on the first stack layer IL1. Due to the trenches TRC, the second stack layer IL2 may be disconnected between adjacent ones of the pixels PX1, PX2, and PX3. A cavity ESS or an empty space may be disposed between the first stack layer IL1 and the second stack layer IL2. The third stack layer IL3 may be disposed on the second stack layer IL2. The third stack layer IL3 may not be disconnected by the trenches TRC, and may be disposed to cover the second stack layer IL2 in each of the trenches TRC. For example, in the three-tandem structure, each of the plurality of trenches TRC may electrically disconnect the first and second stack layers IL1 and IL2, the first charge generation layer, and the second charge generation layer of the display element layer EML between adjacent ones of the pixels PX1, PX2, and PX3. In addition, in the two-tandem structure, each of the plurality of trenches TRC may electrically disconnect a charge generation layer disposed between a lower intermediate layer and an upper intermediate layer and the lower intermediate layer.

In order to stably disconnect the first and second stack layers IL1 and IL2 of the display element layer EML between adjacent ones of the pixels PX1, PX2, and PX3, the height of each of the plurality of trenches TRC may be greater than the height of the pixel defining film PDL. The height of each of the plurality of trenches TRC refers to a length of each of the plurality of trenches TRC in the third direction DR3. The height of the pixel defining film PDL refers to a length of the pixel defining film PDL in the third direction DR3. In order to disconnect the first and second intermediate layers IL1 and IL2 of the display element layer EML between adjacent ones of the pixels PX1, PX2, and PX3, other structures may exist instead of the trenches TRC. For example, instead of the trenches TRC, partition walls having, for example, a reverse tapered shape may be disposed on the pixel defining film PDL.

The number of stack layers IL1, IL2, and IL3 emitting the different light is not limited to that illustrated in FIG. 7. For example, the light emitting stack IL may include two intermediate layers. In this case, any one of the two intermediate layers may be substantially the same as the first stack layer IL1, and the other of the two intermediate layers may include a second hole transporting layer, a second organic light emitting layer, a third organic light emitting layer, and a second electron transporting layer. In this case, a charge generation layer for supplying electrons to any one intermediate layer and supplying charges to the other intermediate layer may be disposed between the two intermediate layers.

It has been illustrated in FIG. 7 that the first to third stack layers IL1, IL2, and IL3 are all disposed in the first emission area EA1, the second emission area EA2, and the third emission area EA3, but an exemplary embodiment of the present disclosure is not limited thereto. For example, the first stack layer IL1 may be disposed in the first emission area EA1, and may not be disposed in the second emission area EA2 and the third emission area EA3. In addition, the second stack layer IL2 may be disposed in the second emission area EA2, and may not be disposed in the first emission area EA1 and the third emission area EA3. In addition, the third stack layer IL3 may be disposed in the third emission area EA3, and may not be disposed on the first emission area EA1 and the second emission area EA2. In this case, first to third color filters CF1, CF2, and CF3 of the optical layer OPL may be omitted.

The second electrode CAT may be disposed on the third stack layer IL3 and commonly connected across the first to third pixels PX1 to PX3. The second electrode CAT may be disposed on the third stack layer IL3 in each of the plurality of trenches TRC. The second electrode CAT may be made of a transparent conductive material (TCO) such as indium tin oxide (ITO) or indium zinc oxide (IZO) capable of transmitting light therethrough or a semi-transmissive conductive material such as magnesium (Mg), silver (Ag), or an alloy of magnesium (Mg) and silver (Ag). When the second electrode CAT is made of the semi-transmissive conductive material, light emission efficiency of each of the first to third pixels PX1, PX2, and PX3 may be increased by a micro cavity.

The encapsulation layer TFE may be disposed on the display element layer EML. The encapsulation layer TFE may include at least one inorganic film TFE1 or TFE2 in order to prevent oxygen or moisture from permeating into the display element layer EML. For example, the encapsulation layer TFE may include a first encapsulation inorganic film TFE1 and a second encapsulation inorganic film TFE2.

The first encapsulation inorganic film TFE1 may be disposed on the second electrode CAT. In one embodiment, the first encapsulation inorganic film TFE1 may be formed as multiple films in which one or more inorganic films of a silicon nitride ($SiN_x$) layer, a silicon oxynitride (SiON) layer, and a silicon oxide ($SiO_x$) layer are alternately stacked. The first encapsulation inorganic film TFE1 may be formed, for example, by a chemical vapor deposition (CVD) process.

The second encapsulation inorganic film TFE2 may be disposed on the first encapsulation inorganic film TFE1. The second encapsulation inorganic film TFE2 may be formed as a titanium oxide ($TiO_x$) layer or an aluminum oxide ($AlO_x$) layer, but an exemplary embodiment of the present disclosure is not limited thereto. The second encapsulation inorganic film TFE2 may be formed by an atomic layer deposition (ALD) process. A thickness of the second encapsulation inorganic film TFE2 may be smaller than a thickness of the first encapsulation inorganic film TFE1. Like the first through third stack layers IL1 to IL3, the first encapsulation inorganic film TFE1 and the second encapsulation in organic film TFE2 may be arranged in steps to form a staircase.

An organic film APL may be included as a layer for increasing interfacial adhesive strength between the encapsulation layer TFE and the optical layer OPL. The organic film APL may, for example, be an organic film made of an acrylic resin, an epoxy resin, a phenolic resin, a polyamide resin, a polyimide resin, or the like.

The optical layer OPL includes a color filter layer CFL and a lens layer LSL.

The color filter layer CFL may include a plurality of color filters CF1, CF2, and CF3. The plurality of color filters CF1, CF2, and CF3 may include first to third color filters CF1, CF2, and CF3. The first to third color filters CF1, CF2, and CF3 may be disposed on the organic film APL.

The first color filter CF1 may overlap the first emission area EA1 of the first pixel PX1. The first color filter CF1 may transmit the light of the first color (e.g., light of the blue wavelength band) therethrough. The blue wavelength band may be approximately 370 nm to 460 nm. Therefore, the first color filter CF1 may transmit the light of the first color among light emitted from the first emission area EA1 therethrough.

The second color filter CF2 may overlap the second emission area EA2 of the second pixel PX2. The second color filter CF2 may transmit the light of the second color (e.g., light of the green wavelength band) therethrough. The green wavelength band may be approximately 480 nm to 560 nm. Therefore, the second color filter CF2 may transmit the light of the second color among light emitted from the second emission area EA2 therethrough.

The third color filter CF3 may overlap the third emission area EA3 of the third pixel PX3. The third color filter CF3 may transmit the light of the third color (e.g., light of the red wavelength band) therethrough. The red wavelength band may be approximately 600 nm to 750 nm. Therefore, the third color filter CF3 may transmit the light of the third color among light emitted from the third emission area EA3 therethrough.

The lens layer LSL may be disposed on the color filter layer CFL. For example, the lens layer LSL may be disposed on the first color filter CF1, the second color filter CF2, and the third color filter CF3. The lens layer may control a refractive index (or a refractive index distribution) of a liquid crystal layer including liquid crystals by controlling tilt angles of the liquid crystals inside the lens layer according to a voltage from a lens controller to be described later (e.g., a voltage set based on a distance between both eyes of a user). For example, the lens layer LSL may allow the liquid crystal layer to perform an optical function like a lens (e.g., a Fresnel lens) by adjusting the refractive index distribution of the liquid crystal layer according to the voltage from the lens controller.

The lens layer LSL includes a first polarizing layer POL1, a first substrate SUB1, a liquid crystal layer LCL, a second substrate SUB2, and a second polarizing layer POL2.

The first polarizing layer POL1 is disposed on the color filter layer CFL. For example, the first polarizing layer POL1 may be disposed between the color filter layer (e.g., the first color filter CF1, the second color filter CF2, and the third color filter CF3) and the first substrate SUB1.

The first substrate SUB1 is disposed on the first polarizing layer POL1. For example, the first substrate SUB1 may be disposed between the first polarizing layer POL1 and the liquid crystal layer LCL.

The liquid crystal layer LCL is disposed on the first substrate SUB1. For example, the liquid crystal layer LCL may be disposed between the first substrate SUB1 and the second substrate SUB2. The liquid crystal layer LCL may include a plurality of liquid crystals LC.

The second substrate SUB2 is disposed on the liquid crystal layer LCL. For example, the second substrate SUB2 may be disposed between the liquid crystal layer LCL and the second polarizing layer POL2.

The second polarizing layer POL2 is disposed on the second substrate SUB2. For example, the second polarizing layer POL2 may be disposed between the second substrate SUB2 and the cover layer CVL. A polarization direction of the second polarizing layer POL2 and a polarization direction of the above-described first polarizing layer POL1 may cross each other.

The cover layer CVL may be disposed on the lens layer LSL. For example, the cover layer CVL may be disposed on the second polarizing layer POL2 of the lens layer LSL. The cover layer CVL may be, for example, a glass substrate or a polymer resin such as a resin.

A third polarizing layer POL3 may be disposed on one surface of the cover layer CVL. The third polarizing layer POL3 may be a structure for preventing deterioration in visibility due to external light reflection. The third polarizing layer POL3 may include, for example, a linear polarizing plate and a phase retardation film. For example, the phase retardation film may be a λ/4 plate (quarter-wave plate), but an exemplary embodiment of the present disclosure is not limited thereto. However, when visibility due to external light reflection is sufficiently improved by the first to third color filters CF1, CF2, and CF3, the third polarizing layer POL3 may be omitted.

Figure 8:
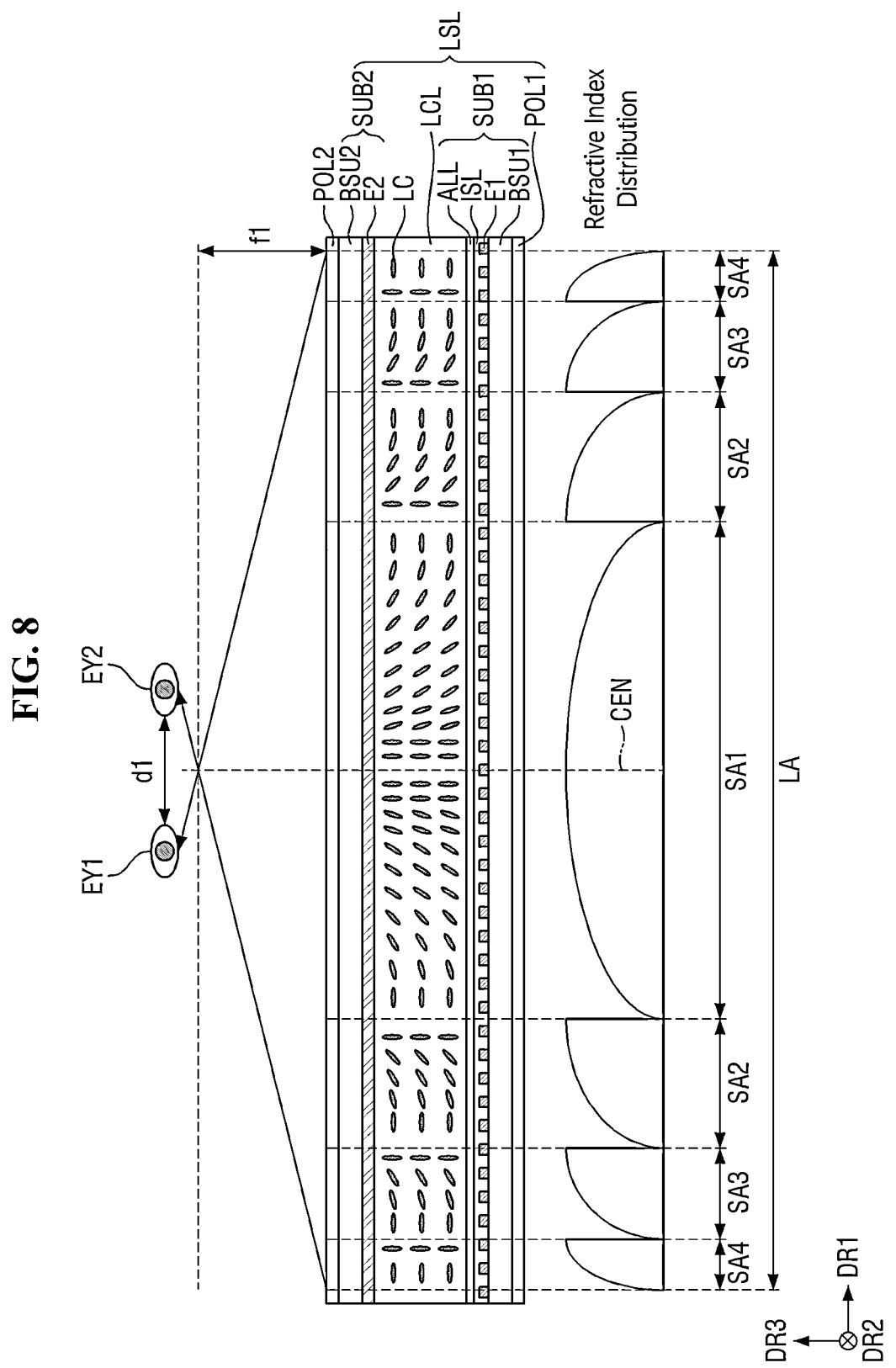
FIG. 8 is a view illustrating a cross section and a refractive index distribution of a lens layer of the display device according to an exemplary embodiment.
Figure 9:
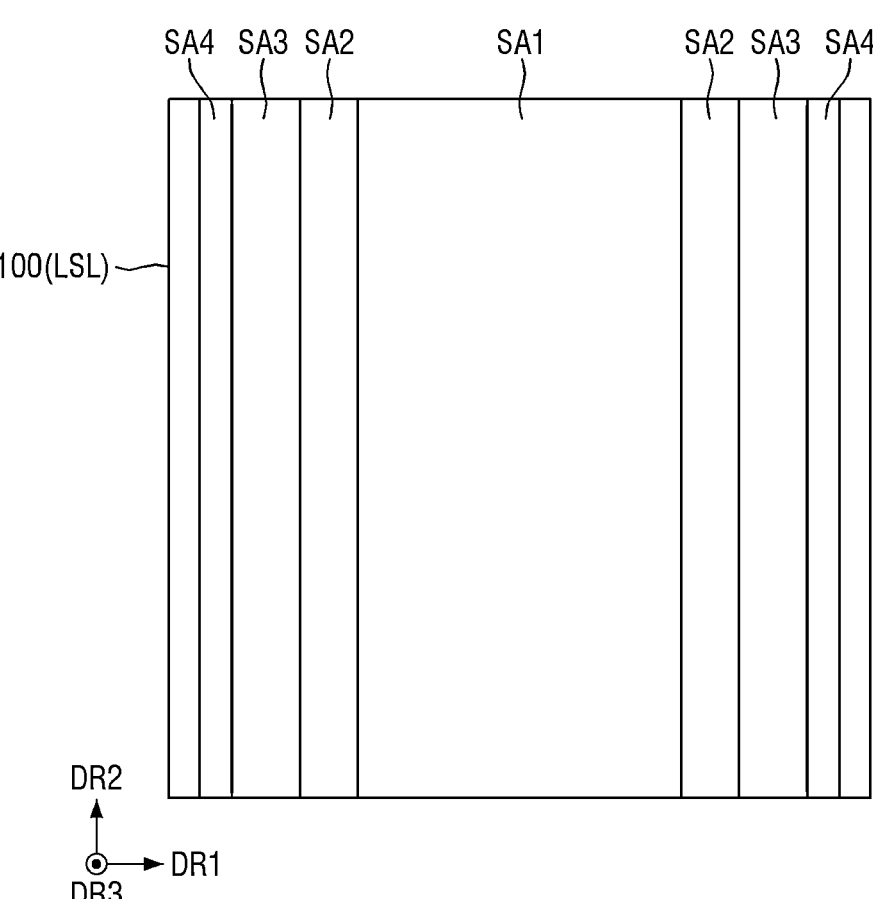
FIG. 9 is a plan view illustrating the refractive index distribution of the lens layer of FIG. 8 according to an exemplary embodiment.

FIG. 8 is a view illustrating a cross section and a refractive index distribution of the lens layer LSL of the display device according to an exemplary embodiment. FIG. 9 is a plan view illustrating the refractive index distribution of the lens layer LSL of FIG. 8. For example, FIGS. 8 and 9 are views illustrating a cross section of the lens layer LSL and a corresponding refractive index distribution (e.g., a refractive index distribution in cross-sectional view and a refractive index distribution in plan view, respectively) of the liquid crystal layer LCL included in the lens layer LSL when a distance between both eyes EY1 and EY2 (e.g., a binocular distance d1) of a user in the first direction DR1 corresponds to a preset reference binocular distance. In the refractive index distribution of FIG. 8, a horizontal axis along the first direction DR1 may refer to distance (e.g., a distance in micrometer (μm) units), and a vertical axis along the third direction may refer to refractive index (Angstrom units (A.U.)).

As illustrated in FIG. 8, the lens layer LSL includes the first polarizing layer POL1, the first substrate SUB1, the liquid crystal layer LCL, the second substrate SUB2, and the second polarizing layer POL2, as described above.

The first substrate SUB1 may include a first base layer BSU1, first control electrodes E1, an insulating layer ISL, and an alignment film ALL. The first base layer BSU1 may be disposed on the first polarizing layer POL1. For example, the first base layer BSU1 may be disposed between the first polarizing layer POL1 and the first control electrodes E1.

The first control electrode E1 may be disposed on the first base layer BSU1. For example, the first control electrodes E1 may be disposed between the first base layer BSU1 and the insulating layer ISL. The first control electrodes E1 may be transparent electrodes. Each of the first control electrodes E1 may receive a first control voltage. In the embodiment shown in FIG. 8, a plurality of first control electrodes E1 are included. At least two of the plurality of first control electrodes E1 may receive first control voltages of different magnitudes. The respective magnitudes of the first control voltages applied to the first control electrodes E1 may be determined based on, for example, the binocular distance of the user.

The insulating layer ISL may be disposed on the first control electrodes E1. For example, the insulating layer ISL may be disposed between the first control electrodes E1 and the alignment film ALL. According to an exemplary embodiment, the insulating layer ISL may be further disposed not only on an upper surface of the first control electrodes E1 but also on side surfaces of the first control electrodes E1 and on the first base layer BSU1 so as to surround each of the first control electrodes E1.

The alignment film ALL may be disposed on the insulating layer ISL. For example, the alignment film ALL may be disposed between the insulating layer ISL and the liquid crystal layer LCL. The alignment film ALL may have grooves for controlling pre-tilt angles of liquid crystals.

The liquid crystal layer LCL may be disposed on the alignment film ALL. For example, the liquid crystal layer LCL may be disposed between the alignment film ALL and a second control electrode E2. The liquid crystal layer LCL may include a plurality of liquid crystals LC (or liquid crystal molecules).

The second substrate SUB2 may include the second control electrode E2 and a second base layer BSU2. The second control electrode E2 may be a single or common electrode disposed on the liquid crystal layer LCL. For example, the second control electrode E2 may be disposed between the liquid crystal layer LCL and the second base layer BSU2. The second control electrode E2 may overlap the plurality of first control electrodes E1. The second control electrode E2 may be a transparent electrode. The second control electrode E2 may receive a second control voltage. The second control voltage may be a direct current (DC) voltage. For example, the second control voltage may be a common voltage. The liquid crystals LC of the liquid crystal layer LCL described above may rotate in a specific direction based on an electric field generated by the first control voltages applied to respective ones of the first control electrodes E1 and the second control voltage applied to the second control electrode E2. Due to such rotation of the liquid crystals LC, angles (e.g., tilt angles) formed between major axes of the liquid crystals LC and the alignment film ALL may be changed.

For each control electrode E1, as the magnitude of the first control voltage applied to the first control electrode E1 increases (or a difference voltage between the first control voltage and the second control voltage increases), the electric field between the first control electrode E1 and the second control electrode E2 may increase. As the electric field increases, the liquid crystals affected by the electric field may rotate. The rotation may take place in a direction in which the angles formed between the alignment film ALL and the major axes of the liquid crystals LC decrease. On the other hand, as the magnitude of the first control voltage decreases (or the difference voltage between the first control voltage and the second control voltage decreases), the electric field between the first control electrode E1 and the second control electrode E2 may decrease. As the electric field decreases, the liquid crystals affected by the electric field may rotate in a direction in which the angles (formed between the alignment film ALL and the major axes of the liquid crystals LC) increase. In this case, rotation directions of the liquid crystals LC may be determined by the pre-tilt angles of the liquid crystals defined by the alignment film ALL.

The second base layer BSU2 may be disposed on the second control electrode E2. For example, the second base layer BSU2 may be disposed between the second control electrode E2 and the second polarizing layer POL2.

The second polarizing layer POL2 may be disposed on the second base layer BSU2. For example, the second polarizing layer POL2 may be disposed between the second base layer BSU2 and the cover layer CVL.

The lens layer LSL may include a lens area LA defined based on a magnitude of the electric field applied to the liquid crystal layer LCL. In one embodiment, the width of the lens area LA may be commensurate with the width of the arrangement of first electrodes. The lens area LA may include a plurality of sub-lens areas. The plurality of sub-lens areas may include a central sub-lens area including the center of the lens layer LSL and one or more outer sub-lens areas disposed on respective sides of the central sub-lens area. The outer sub-lens areas may be disposed on respective sides of the central sub-lens area facing each other in the first direction DR1.

As in an example illustrated in FIGS. 8 and 9, when the binocular distance d1 corresponds to the preset reference binocular distance, the lens layer LSL (or liquid crystal layer LCL of the lens layer LSL) may include a first sub-lens area SA1, second sub-lens areas SA2, third sub-lens areas SA3, and fourth sub-lens areas SA4. Here, the first sub-lens area SA1 may be the central sub-lens area including the center CEN of the lens layer LSL. The second to fourth sub-lens areas SA2, SA3, and SA4 may be outer sub-lens areas sequentially disposed on respective sides of the first sub-lens area SA1. For example, the second sub-lens areas SA2 may be disposed on respective sides of the first (central) sub-lens area SA1 so as to be closest to the first sub-lens area SA1. The third sub-lens areas SA3 may be disposed to be adjacent to the second sub-lens areas SA2. The fourth sub-lens areas SA4 may be disposed to be adjacent to the third sub-lens areas SA3.

The widths of the outer sub-lens areas may decrease as the outer sub-lens areas become more distant from the central sub-lens area (or the center of the lens layer LSL). Here, the width of each of the sub-lens areas SA1, SA2, SA3, and SA4 may refer to a size of each of the sub-lens areas SA1, SA2, SA3, and SA4 in the first direction DR1. For example, as illustrated in the example of FIGS. 8 and 9, the fourth sub-lens area SA4 of the first to fourth sub-lens areas SA1, SA2, SA3, and SA4 may have the smallest width, the third sub-lens area SA3 may have a width greater than the fourth sub-lens area SA4, the second sub-lens area SA2 may have a width greater than the third sub-lens area SA3, and the first sub-lens area SA1 may have the greatest width. In other words, when a width of the first sub-lens area SA1 is defined as a first width, a width of the second sub-lens area SA2 is defined as a second width, a width of the third sub-lens area SA3 is defined as a third width, and a width of the fourth sub-lens area SA4 is defined as a fourth width, the fourth width may be smaller than the third width, the third width may be smaller than the second width, and the second width may be smaller than the first width (e.g., fourth width<third width<second width<first width).

The reference binocular distance described above may refer to, for example, an average distance between the eyes of the human body (hereinafter referred to as an average binocular distance). According to an exemplary embodiment, the average binocular distance may be the same as the binocular distance d1 in FIG. 8 and may serve as a reference value.

When the binocular distance d1 corresponds to the reference binocular distance (or the average binocular distance), the liquid crystal lens controller 900 may control the liquid crystals of the liquid crystal layer LCL so that a focal distance f1 of the lens layer LSL becomes a reference focal distance. As an exemplary embodiment for this purpose, the liquid crystal lens controller 900 may adjust the refractive index distribution of the liquid crystal layer LCL so that the focal distance f1 of the lens layer LSL becomes the reference focal distance. According to an exemplary embodiment for this purpose, the liquid crystal lens controller 900 may adjust the magnitude of the electric field applied to the liquid crystal layer LCL so that the focal distance f1 of the lens layer LSL becomes the reference focal distance. According to an exemplary embodiment for this purpose, the liquid crystal lens controller 900 may control the magnitudes of the first control voltages applied to the first control electrodes E1 so that the focal distance f1 of the lens layer LSL becomes the reference focal distance.

The liquid crystal layer LCL of the lens layer LSL may have refractive index characteristics similar to those of an ideal Fresnel lens. According to an exemplary embodiment for this purpose, at boundary portions between the respective sub-lens areas and in the respective sub-lens areas, angles between the major axes of the liquid crystals LC and the alignment film ALL may be controlled as described below.

For example, in order to secure refractive index characteristics similar to those of the Fresnel lens described above, the lens layer LSL may exhibit a sudden change in refractive index at the boundary portions between the sub-lens areas. For example, a sudden change in the refractive index of the liquid crystal layer LCL may occur at each of a boundary portion between the first sub-lens area SA1 and the second sub-lens area SA2, a boundary portion between the second sub-lens area SA2 and the third sub-lens area SA3, and a boundary portion between the third sub-lens area SA3 and the fourth sub-lens area SA4. According to an exemplary embodiment, in order to effect this sudden change, liquid crystals disposed on either side of the boundary portion between the first sub-lens area SA1 and the second sub-lens area SA2, the boundary portion between the second sub-lens area SA2 and the third sub-lens area SA3, and the boundary portion between the third sub-lens area SA3 and the fourth sub-lens area SA4 may have major axes that change suddenly from 0° to 90° along a direction that becomes increasingly distant from the center of the lens layer LSL.

As an exemplary embodiment for this purpose, a maximum first control voltage may be applied to one or more of the first control electrodes E1 arranged on one side of the boundary portion between the first sub-lens area SA1 and the second sub-lens area SA2, the boundary portion between the second sub-lens area SA2 and the third sub-lens area SA3, and the boundary portion between the third sub-lens area SA3 and the fourth sub-lens area SA4. Also, a minimum first control voltage may be applied to one or more first control electrodes E1 arranged on an opposing side of the aforementioned boundary portions. Here, the maximum first control voltage may be a first control voltage having the greatest value of preset values of the first control voltages, and the minimum first control voltage may be a first control voltage having the smallest value (e.g., 0 or a common voltage) of the preset values of the first control voltages.

In addition, in order for the liquid crystal layer LCL to have the refractive index characteristics similar to those of the ideal Fresnel lens described above, the liquid crystals LC in each sub-lens area may rotate in a direction in which the angles between the major axes of the liquid crystals LC and the alignment film ALL gradually decrease as they become more distant from the center of the lens layer LSL. As an example, as the liquid crystals LC become more distant from the center of the lens layer LSL in the first sub-lens area SA1, the angles formed between the major axes of the liquid crystals LC and the alignment film ALL may gradually decrease. As another example, as the liquid crystals LC become more distant from the center of the lens layer LSL in the second sub-lens area SA2, the angles formed between the major axes of the liquid crystals LC and the alignment film ALL may gradually decrease. According to an exemplary embodiment for this purpose, the first control electrodes E1 of the corresponding sub-lens area may receive a greater first control voltage as they are disposed farther from the center of the lens layer LSL.

Figure 10:
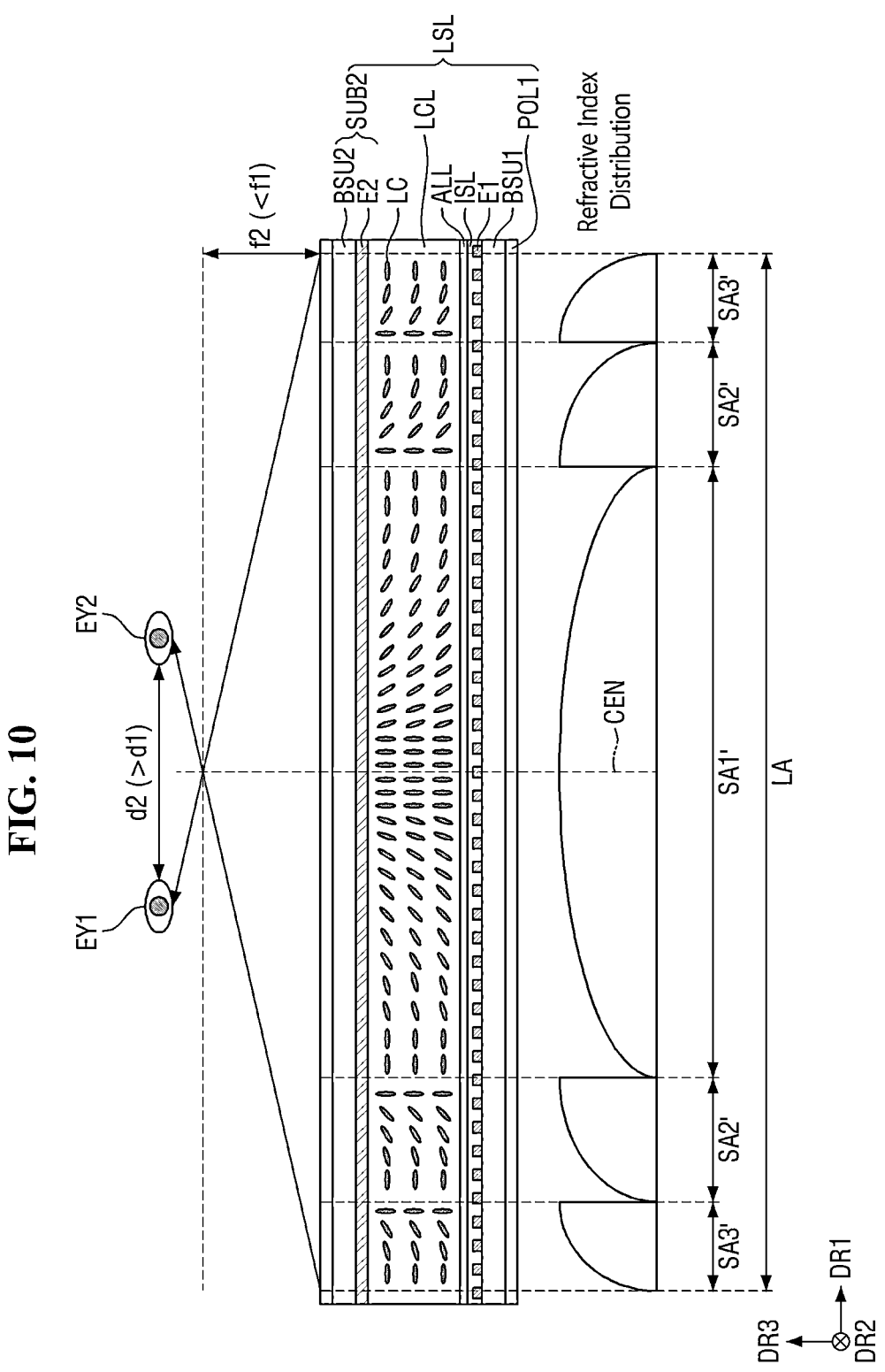
FIG. 10 is a view illustrating a cross section and a refractive index distribution of a lens layer of a display device according to an exemplary embodiment.
Figure 11:
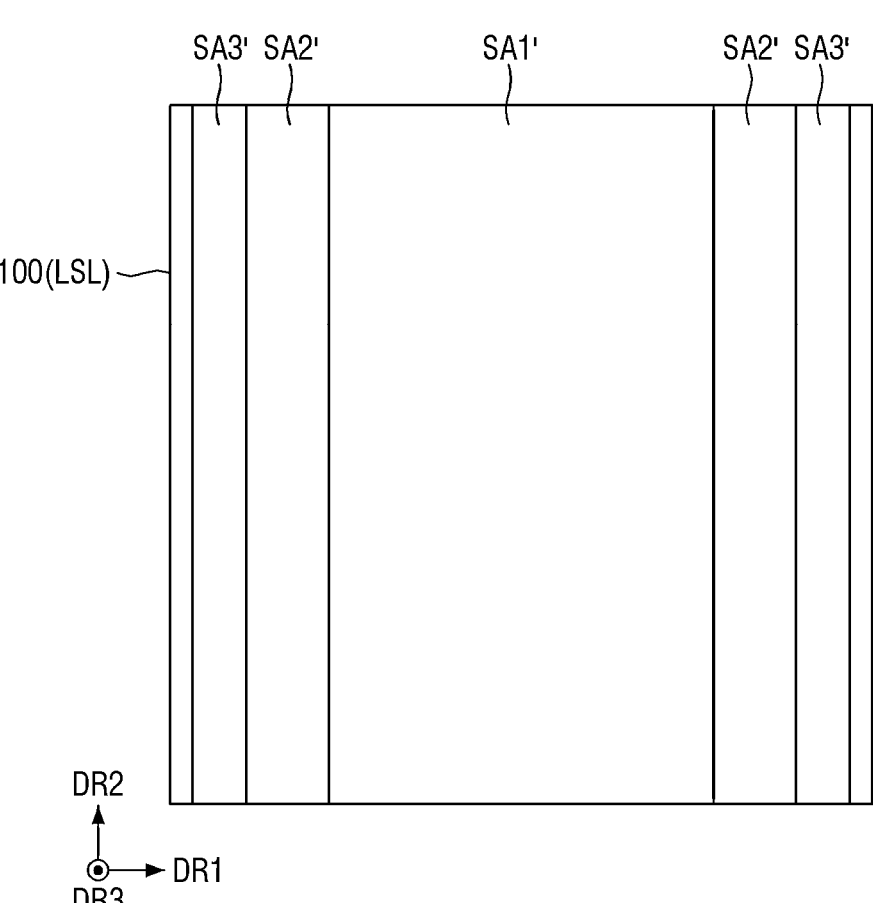
FIG. 11 is a plan view illustrating the refractive index distribution of the lens layer of FIG. 10 according to an exemplary embodiment.

FIG. 10 is a view illustrating a cross section and a refractive index distribution of a lens layer LSL of a display device according to another exemplary embodiment. FIG. 11 is a plan view illustrating the refractive index distribution of the lens layer LSL of FIG. 10. For example, FIGS. 10 and 11 are views illustrating a cross section of the lens layer LSL and a refractive index distribution (e.g., a refractive index distribution in cross-sectional view and a refractive index distribution in plan view, respectively) of the liquid crystal layer LCL included in the lens layer LSL when a binocular distance of the user is greater than the preset reference binocular distance.

As illustrated in FIG. 10, when the binocular distance d2 is greater than the reference binocular distance (e.g., d1) described above, the liquid crystal lens controller 900 may control the refractive index distribution of the liquid crystal layer LCL so that a focal distance f2 of the lens layer LSL decreases further than the reference focal distance f1 described above. According to another exemplary embodiment for this purpose, the liquid crystal lens controller 900 may adjust the magnitude of the electric field applied to the liquid crystal layer LCL so that the focal distance f2 of the lens layer LSL becomes smaller than the reference focal distance (e.g., f1). According to another exemplary embodiment for this purpose, the liquid crystal lens controller 900 may control the magnitudes of the first control voltages applied to the first control electrodes E1 so that the focal distance f2 of the lens layer LSL becomes less than the reference focal distance f1.

According to another exemplary embodiment for this purpose, when the binocular distance d2 is greater than the reference binocular distance d1, the liquid crystal lens controller 900 may control the magnitudes of the first control voltages applied to the first control electrodes E1 so that the size of the central sub-lens area increases and the number of outer sub-lens areas decreases. For example, when the binocular distance d2 is greater than the reference binocular distance d1, the liquid crystal lens controller 900 may control the magnitudes of the first control voltages applied to the first control electrodes E1 so that the size of the central sub-lens area becomes greater than the size of the preset reference central sub-lens area and the number of outer sub-lens areas becomes less than the number of preset reference outer sub-areas.

By controlling the magnitudes of the first control voltages so that the size of the central sub-lens area becomes greater than the size of the preset reference central sub-lens area and the number of outer sub-lens areas becomes smaller than the number of preset reference outer sub-areas as described above, as in an example of FIGS. 10 and 11, a central sub-lens area SA1' may have a width (e.g., a width in the first direction DR1) greater than that of the reference central sub-lens area (e.g., SA1 in FIG. 8) described above, and the number (e.g., two) of outer sub-lens areas SA2' and SA3' may be less than the number (e.g., three) of reference outer sub-lens areas (e.g., the second fourth lens areas SA2, SA3, and SA4 in FIG. 8). Accordingly, when the binocular distance d2 is greater than the reference binocular distance d1, the lens layer LSL of FIGS. 10 and 11 may secure refractive index characteristics of a Fresnel lens having the focal distance f2 smaller than the focal distance f1 of the lens layer LSL of FIGS. 8 and 9.

Figure 12:
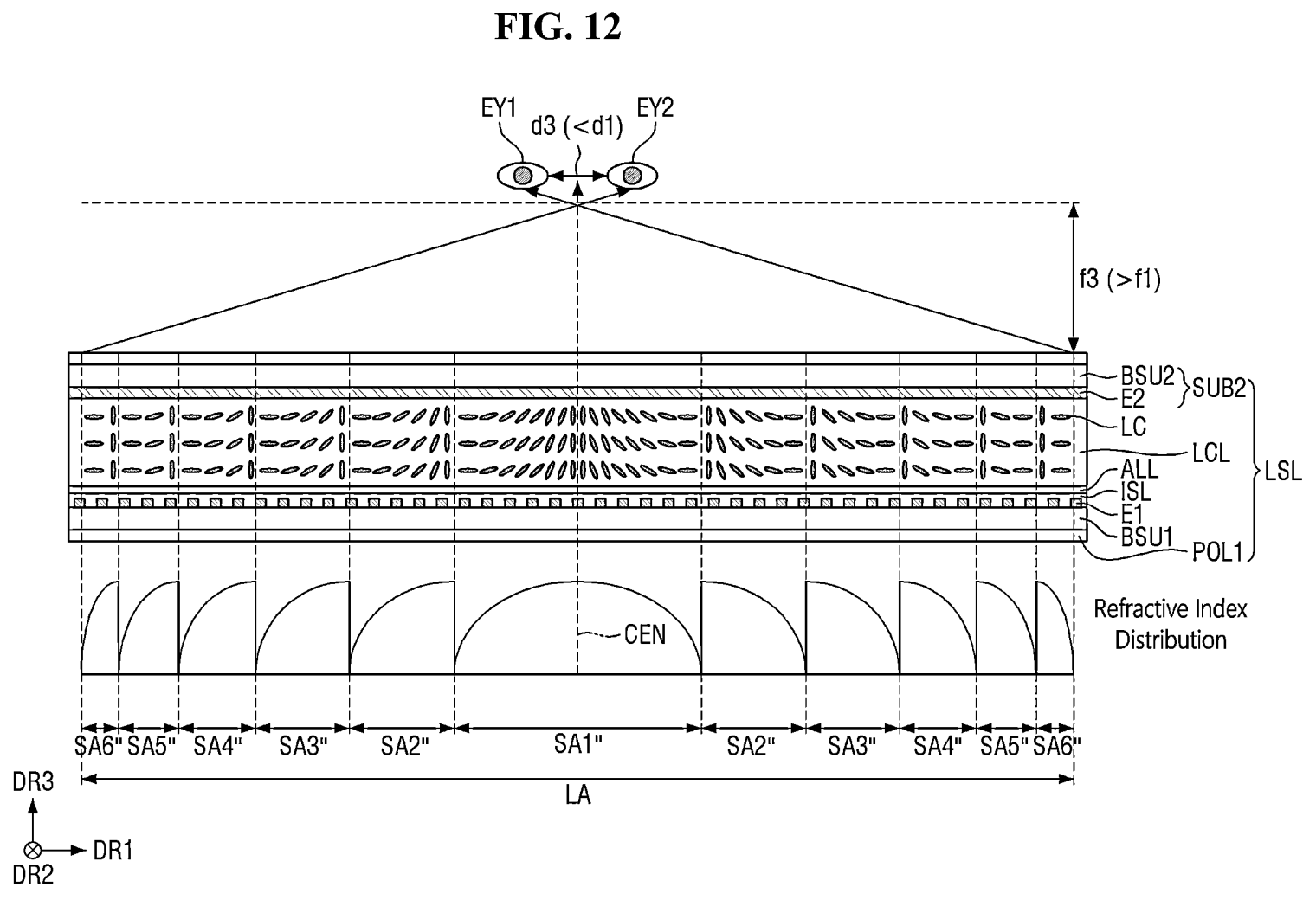
Figure 13:
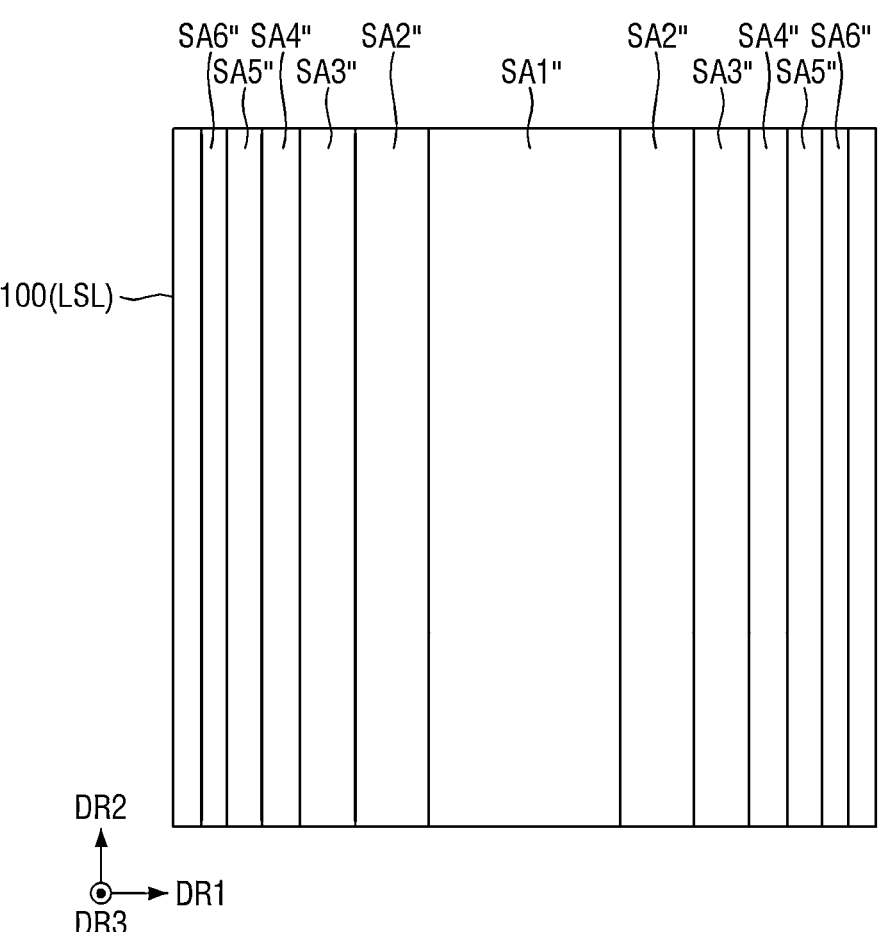
FIG. 13 is a plan view illustrating the refractive index distribution of the lens layer of FIG. 12 according to an exemplary embodiment.

FIG. 12 is a view illustrating a cross section and a corresponding refractive index distribution of a lens layer LSL of a display device according to still another exemplary embodiment. FIG. 13 is a plan view illustrating the refractive index distribution of the lens layer LSL of FIG. 12. For example, FIGS. 12 and 13 are views illustrating a cross section of the lens layer LSL and a refractive index distribution (e.g., a refractive index distribution in cross-sectional view and a refractive index distribution in plan view, respectively) of the liquid crystal layer LCL included in the lens layer LSL when a binocular distance of the user is less than the preset reference binocular distance.

As illustrated in FIG. 12, when the binocular distance d3 is less than the reference binocular distance d1 described above, the liquid crystal lens controller 900 may control the refractive index distribution of the liquid crystal layer LCL so that a focal distance f3 of the lens layer LSL increases further than the reference focal distance (e.g., f1) described above. According to still another exemplary embodiment for this purpose, the liquid crystal lens controller 900 may adjust the magnitude of the electric field applied to the liquid crystal layer LCL so that the focal distance f3 of the lens layer LSL becomes greater than the reference focal distance f1.

According to still another exemplary embodiment for this purpose, the liquid crystal lens controller 900 may control the magnitudes of the first control voltages applied to the first control electrodes E1 so that the focal distance f3 of the lens layer LSL becomes greater than the reference focal distance f1. According to still another exemplary embodiment for this purpose, when the binocular distance d3 is less than the reference binocular distance d1, the liquid crystal lens controller 900 may control the magnitudes of the first control voltages applied to the first control electrodes E1 so that a size of the central sub-lens area decreases and the number of outer sub-lens areas increases. For example, when the binocular distance d3 is less than the reference binocular distance d1, the liquid crystal lens controller 900 may control the magnitudes of the first control voltages applied to the first control electrodes E1 so that a size of the central sub-lens area becomes smaller than a size of a preset reference central sub-lens area and the number of outer sub-lens areas becomes greater than the number of preset reference outer sub-areas.

By controlling the magnitudes of the first control voltages so that the size of the central sub-lens area becomes smaller than the size of the preset reference central sub-lens area and the number of outer sub-lens areas becomes greater than the number of preset reference outer sub-areas as described above, as in an example of FIGS. 12 and 13, a central sub-lens area SA1" may have a width (e.g., a width in the first direction DR1) smaller than that of the reference central sub-lens area (e.g., SA1 in FIG. 8) described above, and the number (e.g., five) of outer sub-lens areas SA2", SA3", SA4", SA5, and SA6" may be greater than the number (e.g., three) of reference outer sub-lens areas (e.g., the second fourth lens areas SA2, SA3, and SA4 in FIG. 8). Accordingly, when the binocular distance d3 is less than the reference binocular distance d1, the lens layer LSL of FIGS. 12 and 13 may secure refractive index characteristics of a Fresnel lens having the focal distance f3 greater than that of the lens layer LSL of FIGS. 8 and 9.

Figure 14:
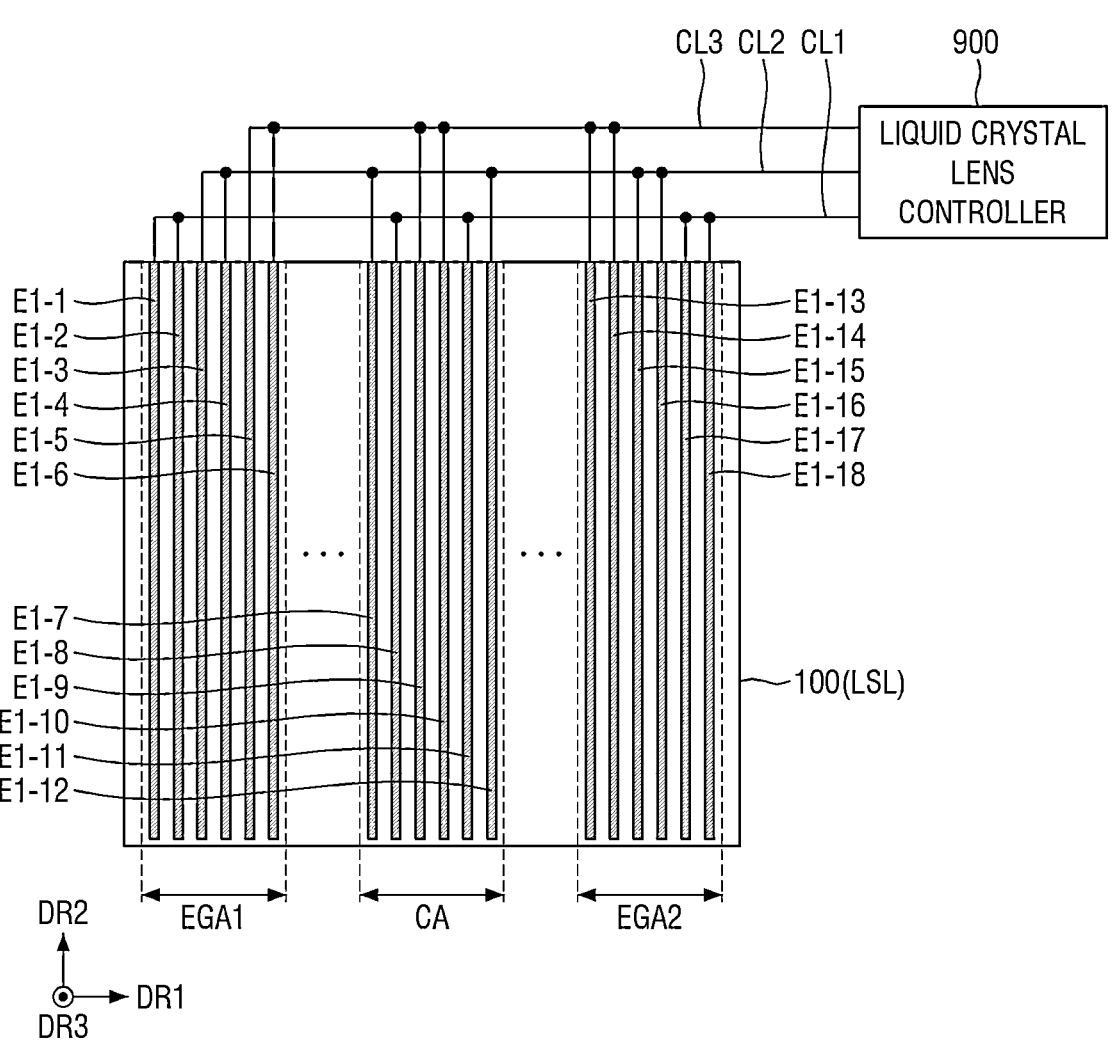
FIG. 14 is a plan view of a display device according to an exemplary embodiment.

FIG. 14 is a plan view of a display device according to an exemplary embodiment.

As illustrated in FIG. 14, the first control electrodes E1 of the lens layer LSL may include a first-first control electrode E1-1, a first-second control electrode E1-2, a first-third control electrode E1-3, a first-fourth control electrode E1-4, a first-fifth control electrode E1-5, a first-sixth control electrode E1-6, a first-seventh control electrode E1-7, a first-eighth control electrode E1-8, a first-ninth control electrode E1-9, a first-tenth control electrode E1-10, a first-eleventh control electrode E1-11, a first-twelfth control electrode E1-12, a first-thirteenth control electrode E1-13, a first-fourteenth control electrode E1-14, a first-fifteenth control electrode E1-15, a first-sixteenth control electrode E1-16, a first-seventeenth control electrode E1-17, and a first-eighteenth control electrode E1-18.

As an example illustrated in FIG. 14, at least one first control electrode E1 disposed at a central portion CA of the lens layer LSL, at least one first control electrode E1 disposed at a first edge EGA1 of the lens layer LSL, and at least one first control electrode E1 disposed at the second edge EGA2 of the lens layer LSL may be connected to the same control line.

According to an exemplary embodiment, the first-eighth control electrode E1-8 and the first-eleventh control electrode E1-11 of the first control electrodes E1 disposed at the central portion CA of the lens layer LSL, the first-first control electrode E1-1 and the first-second control electrode E1-2 of the first control electrodes E1 disposed at the first edge EGA1 of the lens layer LSL, and the first-seventeenth control electrode E1-17 and the first-eighteenth control electrode E1-18 of the first control electrodes E1 disposed at the second edge EGA2 of the lens layer LSL may be commonly connected to a first control line CL1.

Accordingly, the first-eighth control electrode E1-8, the first-eleventh control electrode E1-11, the first-first control electrode E1-1, the first-second control electrode E1-2, the first-seventeenth control electrode E1-17, and the first-eighteenth control electrode E1-18 may commonly receive the first control voltage provided from the liquid crystal lens controller 900 through the first control line CL1.

Here, the first-eighth control electrode E1-8 and the first-eleventh control electrode E1-11 of the first control electrodes E1 connected to the first control line CL1 may be disposed at the same distance from the center CEN (e.g., see FIG. 8) of the lens layer LSL, the first-first control electrode E1-1 and the first-eighteenth control electrode E1-18 of the first control electrodes E1 connected to the first control line CL1 may be disposed at the same distance from the center CEN of the lens layer LSL, and the first-second control electrode E1-2 and the first-seventeenth control electrode E1-17 of the first control electrodes E1 connected to the first control line CL1 may be disposed at the same distance from the center CEN of the lens layer LSL.

According to an exemplary embodiment, the first-seventh control electrode E1-7 and the first-twelfth control electrode E1-12 of the first control electrodes E1 disposed at the central portion CA of the lens layer LSL, the first-third control electrode E1-3 and the first-fourth control electrode E1-4 of the first control electrodes E1 disposed at the first edge EGA1 of the lens layer LSL, and the first-fifteenth control electrode E1-15 and the first-sixteenth control electrode E1-16 of the first control electrodes E1 disposed at the second edge EGA2 of the lens layer LSL may be commonly connected to a second control line CL2.

Accordingly, the first-seventh control electrode E1-7, the first-twelfth control electrode E1-12, the first-third control electrode E1-3, the first-fourth control electrode E1-4, the first-fifteenth control electrode E1-15, and the first-sixteenth control electrode E1-16 may commonly receive the first control voltage provided from the liquid crystal lens controller 900 through the second control line CL2.

Here, the first-seventh control electrode E1-7 and the first-twelfth control electrode E1-12 of the first control electrodes E1 connected to the second control line CL2 may be disposed at the same distance from the center CEN of the lens layer LSL, the first-fourth control electrode E1-4 and the first-fifteenth control electrode E1-15 of the first control electrodes E1 connected to the second control line CL2 may be disposed at the same distance from the center CEN of the lens layer LSL, and the first-third control electrode E1-3 and the first-sixteenth control electrode E1-16 of the first control electrodes E1 connected to the second control line CL2 may be disposed at the same distance from the center CEN of the lens layer LSL.

According to an exemplary embodiment, the first-ninth control electrode E1-9 and the first-tenth control electrode E1-10 of the first control electrodes E1 disposed at the central portion CA of the lens layer LSL, the first-fifth control electrode E1-5 and the first-sixth control electrode E1-6 of the first control electrodes E1 disposed at the first edge EGA1 of the lens layer LSL, and the first-thirteenth control electrode E1-13 and the first-fourteenth control electrode E1-14 of the first control electrodes E1 disposed at the second edge EGA2 of the lens layer LSL may be commonly connected to a third control line CL3.

Accordingly, the first-ninth control electrode E1-9, the first-tenth control electrode E1-10, the first-fifth control electrode E1-5, the first-sixth control electrode E1-6, the first-thirteenth control electrode E1-13, and the first-fourteenth control electrode E1-14 may commonly receive the first control voltage provided from the liquid crystal lens controller 900 through the third control line CL3.

Here, the first-ninth control electrode E1-9 and the first-tenth control electrode E1-10 of the first control electrodes E1 connected to the third control line CL3 may be disposed at the same distance from the center CEN of the lens layer LSL, the first-sixth control electrode E1-6 and the first-thirteenth control electrode E1-13 of the first control electrodes E1 connected to the third control line CL3 may be disposed at the same distance from the center CEN of the lens layer LSL, and the first-fifth control electrode E1-5 and the first-fourteenth control electrode E1-14 of the first control electrodes E1 connected to the third control line CL3 may be disposed at the same distance from the center CEN of the lens layer LSL.

As described above, the plurality of first control electrodes E1 disposed at the central portion CA, the first edge EGA1, and second edge EGA2 of the lens layer LSL are connected to one control line. As a result, the number of control lines may decrease.

Figure 15:
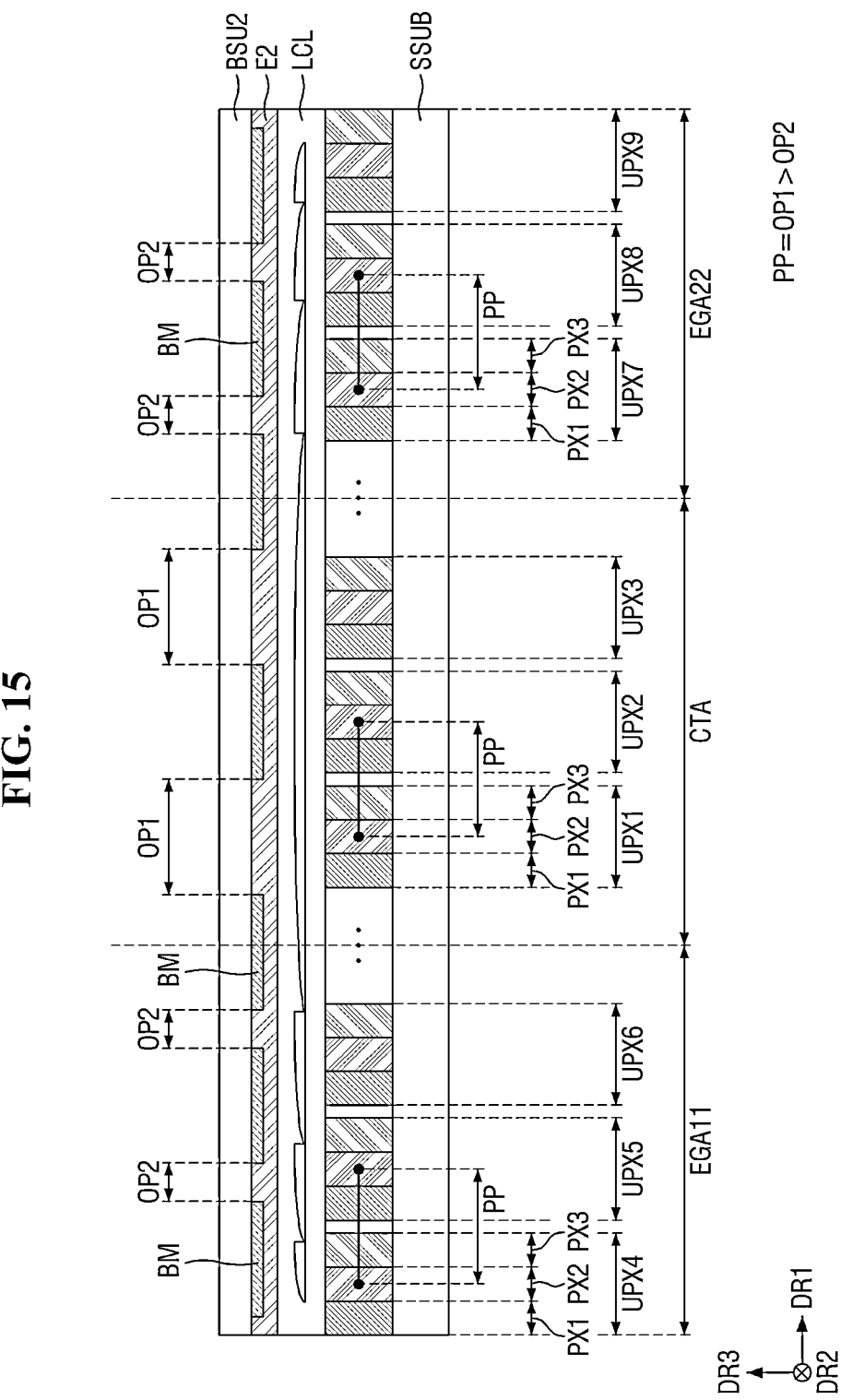
FIG. 15 is a view illustrating a cross section of a display device according to an exemplary embodiment and a refractive index distribution of a lens layer.

FIG. 15 is a view illustrating a cross section of a display device according to another exemplary embodiment and a refractive index distribution of a lens layer LSL.

As illustrated in FIG. 15, a display device according to another exemplary embodiment may further include a light blocking layer BM. For example, the lens layer LSL included in the display device may further include a light blocking layer BM. The light blocking layer BM may be included in, for example, the second substrate SUB2 of the lens layer LSL. In other words, the second substrate SUB2 may further include the light blocking layer BM.

The light blocking layer BM may be disposed on the second control electrode E2. For example, the light blocking layer BM may be disposed between the second control electrode E2 and the second base layer BSU2.

The light blocking layer BM may include a plurality of openings OP1 and OP2. The plurality of openings OP1 and OP2 may include first openings OP1 and second openings OP2 having different widths. Here, the widths of the respective openings OP1 and OP2 may be sizes of the respective openings in the first direction DR1. For example, according to another exemplary embodiment, the binocular distance, the widths of the sub-lens areas, and the widths of the openings of the light blocking layer BM may all be sizes in the same direction (e.g., the first direction DR1).

A plurality of unit pixels (e.g., UPX1, UPX2, and UPX3) may be disposed at a central portion CTA of the lens layer LSL (or the display panel 100) including the liquid crystal layer LCL, a plurality of unit pixels (e.g., UPX4, UPX5, and UPX6) may be disposed at a first edge EGA11 of the lens layer LSL (or the display panel 100) including the liquid crystal layer LCL, and a plurality of unit pixels (e.g., UPX7, UPX8, and UPX9) may be disposed at a second edge EGA22 of the lens layer LSL (or the display panel 100) including the liquid crystal layer LCL Here, each of the unit pixels UPX1 to UPX9 may include a first pixel PX1, a second pixel PX2, and a third pixel PX3 as previously discussed. The unit pixels UPX4, UPX5, and UPX6 may be located on one side of the central portion CTA, and the unit pixels UPX7, UPX8, and UPX9 may be located on an opposing side of the central portion CTA.

The first openings OP1 of the light blocking layer BM may be disposed at the central portion CTA of the lens layer LSL. The second openings OP2 of the light blocking layer BM may be disposed at the first edge EAG11 of the lens layer LSL and the second edge EGA22 of the lens layer LSL. At lease one second opening OP2 may be included in each of the edges EGA11 and EGA22. The width of the second opening OP2 may be less than the width of the first opening OP1. In one embodiment, the first edge EGA11 may include a plurality of the second openings OP2 and the second edge EGA22 may include a plurality of the second openings OP2 to be symmetrical with the second openings in the first edge EGA11.

In one embodiment, the width of the first opening OP1 may be substantially the same as a pixel pitch PP, and the width of the second opening OP2 may be less than the pixel pitch PP. Here, the pixel pitch PP may be a center distance between unit pixels adjacent to each other in the first direction DR1.

As described above, the second openings OP2 of the light blocking layer BM at both edges EGA11 and EGA22 of the lens layer LSL have a smaller width than the first openings OP1 of the light blocking layer BM at the central portion CTA of the lens layer LSL. As a result, a color mixing phenomenon in which images of adjacent unit pixels UPX are mixed with each other may be reduced or minimized. Accordingly, image quality of the display device may be improved.

Figure 16:
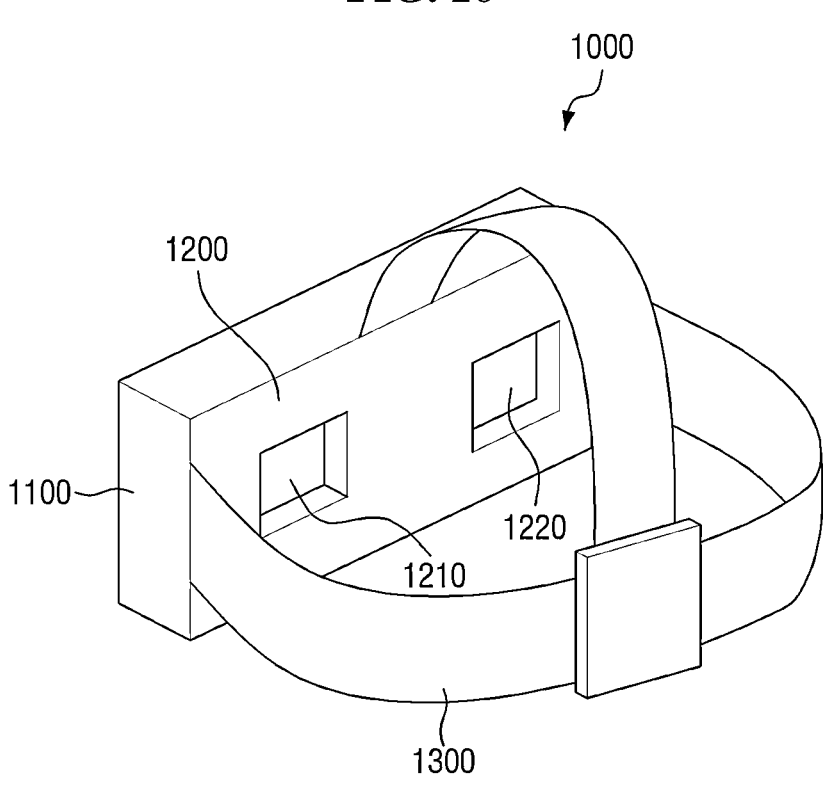
FIG. 16 is a perspective view illustrating a head mounted display device according to an exemplary embodiment.
Figure 17:
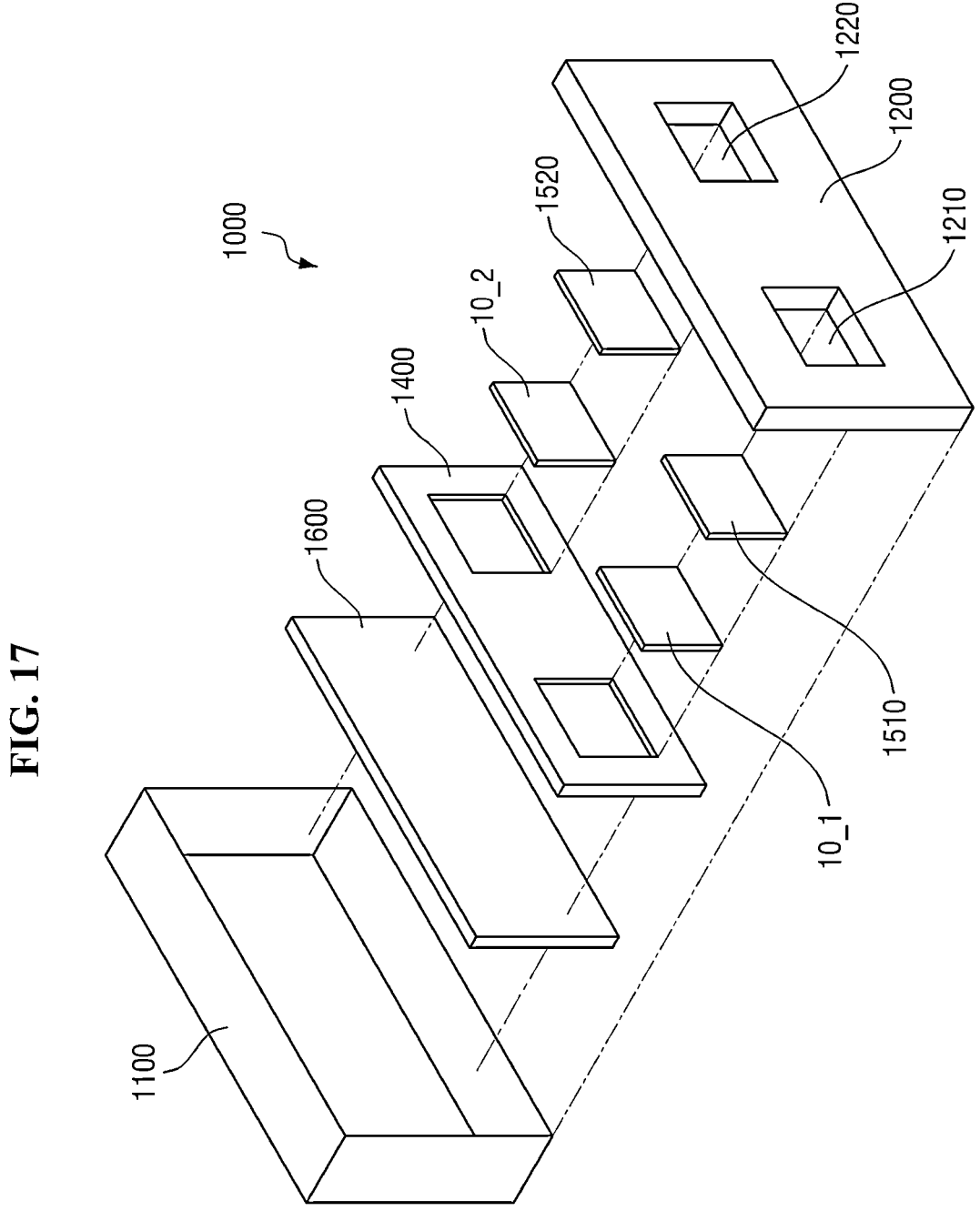
FIG. 17 is an exploded perspective view illustrating an example of the head mounted display device of FIG. 16.

FIG. 16 is a perspective view illustrating a head mounted display device 1000 according to an exemplary embodiment. FIG. 17 is an exploded perspective view illustrating an example of the head mounted display device of FIG. 16.

Referring to FIGS. 16 and 17, the head mounted display device 1000 according to an exemplary embodiment includes a first display device 10_1, a second display device 10_2, a display device housing part 1100, a housing part cover 1200, a first eyepiece 1210, a second eyepiece 1220, a head mounted band 1300, a middle frame 1400, a first optical member 1510, a second optical member 1520, and a control circuit board 1600.

The first display device 10_1 provides an image to a user's left eye, and the second display device 10_2 provides an image to a user's right eye. Each of the first display device 10_1 and the second display device 10_2 is substantially the same as the display device 10 described with reference to FIGS. 1 and 2.

The first optical member 1510 may be disposed between the first display device 10_1 and the first eyepiece 1210. The second optical member 1520 may be disposed between the second display device 10_2 and the second eyepiece 1220. Each of the first optical member 1510 and the second optical member 1520 may include at least one convex lens.

The middle frame 1400 may be disposed between the first display device 10_1 and the control circuit board 1600 and may be disposed between the second display device 10_2 and the control circuit board 1600. The middle frame 1400 serves to support and fix the first display device 10_1, the second display device 10_2, and the control circuit board 1600.

The control circuit board 1600 may be disposed between the middle frame 1400 and the display device housing part 1100. The control circuit board 1600 may be connected to the first display device 10_1 and the second display device 10_2 through a connector. The control circuit board 1600 may convert an image source input from a host or external source into digital video data DATA, and transmit the digital video data DATA to the first display device 10_1 and the second display device 10_2 through the connector.

The control circuit board 1600 may transmit digital video data DATA corresponding to a left eye image optimized for the user's left eye to the first display device 10_1 and transmit digital video data DATA corresponding to a right eye image optimized for the user's right eye to the second display device 10_2. In one embodiment, the control circuit board 1600 may transmit the same digital video data DATA to the first display device 10_1 and the second display device 10_2.

The display device housing part 1100 serves to house the first display device 10_1, the second display device 10_2, the middle frame 1400, the first optical member 1510, the second optical member 1520, and the control circuit board 1600. The housing part cover 1200 is disposed to cover opened one surface of the display device housing part 1100. The housing part cover 1200 may include the first eyepiece 1210 on which the user's left eye is disposed and the second eyepiece 1220 on which the user's right eye is disposed. It has been illustrated in FIGS. 16 and 17 that the first eyepiece 1210 and the second eyepiece 1220 are separately disposed, but an exemplary embodiment of the present disclosure is not limited thereto. The first eyepiece 1210 and the second eyepiece 1220 may be merged as one eyepiece.

The first eyepiece 1210 may be aligned with the first display device 10_1 and the first optical member 1510, and the second eyepiece 1220 may be aligned with the second display device 10_2 and the second optical member 1520. Accordingly, a user may view an image of the first display device 10_1 magnified as a virtual image by the first optical member 1510 through the first eyepiece 1210, and may view an image of the second display device 10_2 magnified as a virtual image by the second optical member 1520 through the second eyepiece 1220.

The head mounted band 1300 serves to fix the display device housing part 1100 to the user's head so that the first eyepiece 1210 and the second eyepiece 1220 of the housing part cover 1200 may be maintained in a state in which they are disposed on the user's left eye and right eye, respectively. When the display device housing part 1200 is implemented to have light weight and a small size, the head mounted display device 1000 may include an eyeglass frame as illustrated, for example, in FIG. 18 instead of the head mounted band 800.

In addition, the head mounted display device 1000 may include a number of additional features. For example, the head mounted display device 1000 may further include a battery for supplying power, an external memory slot for housing an external memory, and an external connection port and a wireless communication module for receiving an image source. For example, the external connection port may be a universe serial bus (USB) terminal, a display port, or a high-definition multimedia interface (HDMI) terminal, and the wireless communication module may be a 5G communication module, a 4G communication module, a wireless fidelity (WiFi) module, or a Bluetooth module.

Figure 18:
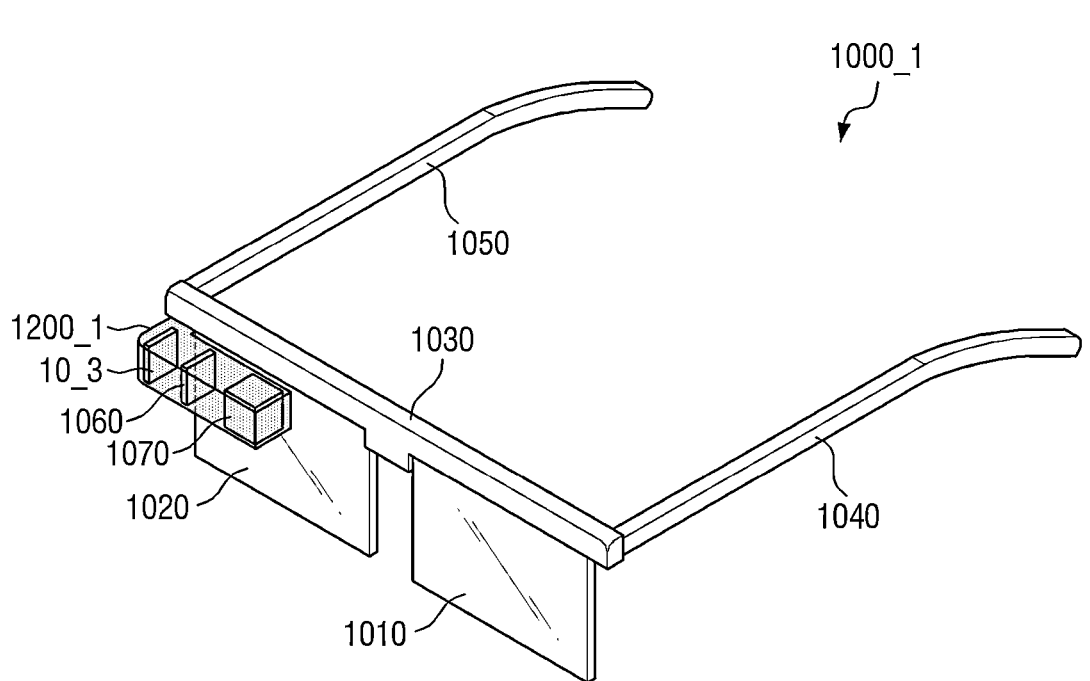
FIG. 18 is a perspective view illustrating a head mounted display device according to an exemplary embodiment.

FIG. 18 is a perspective view illustrating a head mounted display device 1000_1 according to another exemplary embodiment.

Referring to FIG. 18, the head mounted display device 1000_1 according to another exemplary embodiment may be a glasses-type display device in which a display device housing part 1200_1 is implemented to have light weight and a small size. The head mounted display device 1000_1 according to another exemplary embodiment may include a display device 10_3, a left eye lens 1010, a right eye lens 1020, a support frame 1030, glasses frame legs 1040 and 1050, an optical member 1600, an optical path conversion member (or optical path converter) 1070, and a display device housing part 1200_1.

The display device housing part 1200_1 may include the display device 10_3, the optical member 1600, and the optical path conversion member 1070. An image displayed on the display device 10_3 may be magnified by the optical member 1600, converted in an optical path by the optical path conversion member 1070, and provided to a user's right eye through the right eye lens 1020. For this reason, a user may view an augmented reality image in which a virtual image displayed on the display device 10_3 through his/her right eye and a real image seen through the right eye lens 1020 are combined with each other.

It has been illustrated in FIG. 18 that the display device housing part 1200_1 is disposed at a right end of the support frame 1030, but an exemplary embodiment of the present disclosure is not limited thereto. For example, the display device housing part 1200_1 may be disposed at a left end of the support frame 1030, and in this case, an image of the display device 10_3 may be provided to a user's left eye. In one embodiment, the display device housing parts 1200_1 may be disposed at both the left and right ends of the support frame 1030. In this case, the user may view an image displayed on the display device 10_3 through both his/her left and right eyes.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims. The embodiments may be combined to form additional embodiments.

What is claimed is:

1. A display device comprising:
a substrate;
a first electrode disposed on the substrate;
a light emitting layer disposed on the first electrode;
a second electrode disposed on the light emitting layer;
a color filter layer disposed on the second electrode;
a lens layer disposed on the color filter layer; and
a light blocking layer disposed on the lens layer and having a plurality of openings in a display area of the substrate, wherein the openings of the light blocking layer include a first opening disposed at a central portion of the display area and a second opening disposed at an outer portion of the display area, and wherein a size of the first opening is greater than a size of the second opening.

2. The display device of claim 1, wherein the size of the first opening in a first direction is equal to a pixel pitch.

3. The display device of claim 1, wherein the size of the second opening in a first direction is smaller than a pixel pitch.

4. The display device of claim 1, further comprising:
a liquid crystal lens controller configured to receive information on a binocular distance of a user in a first direction and controlling the lens layer.

5. The display device of claim 4, wherein the liquid crystal lens controller is configured to control a focal distance of the lens layer based on the binocular distance.

6. The display device of claim 5, wherein:
when the binocular distance is greater than a preset reference binocular distance, the liquid crystal lens controller is configured to decrease the focal distance of the lens layer, and
when the binocular distance is less than the reference binocular distance, the liquid crystal lens controller is configured to increase the focal distance of the lens layer.

7. The display device of claim 5, wherein:
the lens layer includes a lens area and a liquid crystal layer, the lens area defined based on a magnitude of an electric field applied to the liquid crystal layer,
the lens area includes a central sub-lens area and one or more outer sub-lens areas, the central sub-lens area including a center of the lens layer and the one or more outer sub-lens areas disposed on at least one side of the central sub-lens area, and
the liquid crystal lens controller is configured to control the focal distance of the lens layer by changing a width of the central sub-lens area and a number of the outer sub-lens areas based on the binocular distance.

8. The display device of claim 7, wherein:
when the binocular distance is greater than a preset reference binocular distance, the liquid crystal lens controller is configured to increase the width of the central sub-lens area and decrease the number of outer sub-lens areas, and when the binocular distance is less than the reference binocular distance, the liquid crystal lens controller is configured to decrease the width of the central sub-lens area and increase the number of the outer sub-lens areas.

9. The display device of claim 7, wherein:
the lens area include a plurality of outer sub-lens areas, and
the plurality of outer sub-lens areas have smaller widths with increasing distance from the center of the lens layer.

10. The display device of claim 1, wherein the lens layer includes:
a first polarizing layer disposed on the color filter layer;
a first substrate disposed on the first polarizing layer;
a liquid crystal layer disposed on the first substrate;
a second substrate disposed on the liquid crystal layer; and
a second polarizing layer disposed on the second substrate.

11. The display device of claim 10, wherein the first substrate includes:
a first base layer disposed on the first polarizing layer;
a plurality of first control electrodes disposed on the first base layer;
an insulating layer disposed on the plurality of first control electrodes; and
an alignment film disposed on the insulating layer.

12. The display device of claim 11, wherein the second substrate includes:
a second control electrode disposed on the liquid crystal layer;
the light blocking layer disposed on the second control electrode;
a second base layer disposed on the light blocking layer.

13. The display device of claim 12, wherein the second control electrode overlaps the plurality of first control electrodes.

14. The display device of claim 13, wherein at least two of the plurality of first control electrodes are commonly connected to one control line.

15. The display device of claim 14, wherein at least one of the plurality of first control electrodes disposed at a center portion of the lens layer, at least one of the plurality of first control electrodes disposed at a first edge of the lens layer, and at least one of the plurality of first control electrodes disposed at a second edge of the lens layer are commonly connected to the one control line.

16. An optical device comprising:
a display device; and
an optical path converter disposed on the display device, wherein the display device includes:
a substrate;
a first electrode disposed on the substrate;
a light emitting layer disposed on the first electrode;
a second electrode disposed on the light emitting layer;

a color filter layer disposed on the second electrode;
a lens layer disposed on the color filter layer; and
a light blocking layer disposed on the lens layer and having a plurality of openings in a display area of the substrate, the openings of the light blocking layer including a first opening disposed at a central portion of the display area and a second opening disposed at an outer portion of the display area, and a size of the first opening is greater than a size of the second opening.

17. The optical device of claim 16, wherein the size of the first opening in a first direction is equal to a pixel pitch.

18. The optical device of claim 16, wherein the size of the second opening in a first direction is less than a pixel pitch.

19. The optical device of claim 16, wherein the display device further includes:
a liquid crystal lens controller configured to receive information indicative of a binocular distance of a user in a first direction and to control the lens layer.

20. The optical device of claim 19, wherein the liquid crystal lens controller is configured to control a focal distance of the lens layer based on the binocular distance.

21. The optical device of claim 20, wherein:
when the binocular distance is greater than a preset reference binocular distance, the liquid crystal lens controller is configured to decrease the focal distance of the lens layer, and
when the binocular distance is less than the reference binocular distance, the liquid crystal lens controller is configured to increase the focal distance of the lens layer.

22. The optical device of claim 20, wherein:
the lens layer includes a lens area and a liquid crystal layer, the lens area defined based on a magnitude of an electric field applied to the liquid crystal layer of the lens layer,
the lens area includes a central sub-lens area including a center of the lens layer and one or more outer sub-lens areas disposed on at least one side of the central sub-lens area, and
the liquid crystal lens controller is configured to control the focal distance of the lens layer by changing a width of the central sub-lens area and a number of the outer sub-lens areas based on the binocular distance.

23. The optical device of claim 22, wherein:
when the binocular distance is greater than a preset reference binocular distance, the liquid crystal lens controller is configured to increase a width of the central sub-lens area and decrease the number of outer sub-lens areas, and
when the binocular distance is less than the reference binocular distance, the liquid crystal lens controller is configured to decrease the width of the central sub-lens area and increase the number of the outer sub-lens areas.

* * * * *